(12) United States Patent
Jang et al.

(10) Patent No.: US 12,713,563 B2
(45) Date of Patent: Aug. 18, 2026

(54) ELECTRONIC DEVICE COMPRISING HEAT DISSIPATION STRUCTURE PROVIDING HEAT TRANSFER PATH

(71) Applicant: SAMSUNG ELECTRONICS CO., LTD., Suwon-si (KR)

(72) Inventors: Kyungsoo Jang, Suwon-si (KR); Yongwoon Kim, Suwon-si (KR); Sangwon Lee, Suwon-si (KR); Eunsoo Park, Suwon-si (KR); Jinwan An, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 256 days.

(21) Appl. No.: 18/750,244

(22) Filed: Jun. 21, 2024

(65) Prior Publication Data

US 2025/0089215 A1 Mar. 13, 2025

Related U.S. Application Data

(63) Continuation of application No. PCT/KR2024/006856, filed on May 21, 2024.

(30) Foreign Application Priority Data

Sep. 11, 2023 (KR) ........................ 10-2023-0120743
Sep. 27, 2023 (KR) ........................ 10-2023-0131213

(51) Int. Cl.
*H05K 7/20* (2006.01)
*H05K 9/00* (2006.01)

(52) U.S. Cl.
CPC ......... *H05K 7/2039* (2013.01); *H05K 9/0024* (2013.01)

(58) Field of Classification Search
CPC .... H05K 7/1427; H05K 7/20; H05K 7/20209; H05K 7/20336; H05K 7/2039;
(Continued)

(56) References Cited

U.S. PATENT DOCUMENTS 6,744,640 B2 6/2004 Reis et al.
10,104,763 B2 10/2018 Lee et al.
(Continued)

FOREIGN PATENT DOCUMENTS

CN 1659942 8/2005
CN 106455411 A 2/2017
(Continued)

OTHER PUBLICATIONS

Search Report and Written Opinion dated Sep. 13, 2024 issued in International Patent Application No. PCT/KR2024/006856.

*Primary Examiner* — Amir A Jalali
(74) *Attorney, Agent, or Firm* — Nixon & Vanderhye, P.C.

(57) ABSTRACT

An electronic device is disclosed. The electronic device includes a first shield can configured to accommodate an electronic component, a second shield can spaced apart from the first shield can, a heat dissipation structure comprising a heat dissipation material including an end connected to the first shield can and another end connected to the second shield can, and a thermally conductive material disposed in the heat dissipation structure, extending from at least a portion of an inner space of the first shield can to at least a portion of an inner space of the second shield can through the heat dissipation structure.

20 Claims, 14 Drawing Sheets

(58) Field of Classification Search
CPC ............... H05K 7/20409; H05K 7/205; H05K 7/20509; H05K 7/20963; H05K 9/0007; H05K 9/0022; H05K 9/0024; H05K 9/0032; H05K 9/0081; H05K 9/0084; H05K 9/0088; H05K 1/0203–0204; H05K 1/0216; H05K 1/0243; H05K 1/181–182; G06F 1/20; G06F 1/203; G06F 1/206; G06F 1/1656; G06F 1/1658; H04K 2201/066; H04K 2201/0707; H04K 2201/0715; H04K 2201/10371; H04K 2201/10507; H04K 2201/10522
See application file for complete search history.

(56) References Cited

U.S. PATENT DOCUMENTS 10,209,744 B2 2/2019 Wang et al.
10,642,323 B2 5/2020 Lee et al.
10,699,985 B2 6/2020 Chung et al.
10,959,350 B2 3/2021 Lee et al.
11,013,150 B2 5/2021 Kim et al.
11,051,435 B2 6/2021 Yun et al.
11,379,022 B2 7/2022 Park et al.
11,399,445 B2 7/2022 Park et al.
2017/0163302 A1 6/2017 Saeidi et al.
2018/0042147 A1* 2/2018 Mun ..................... H10W 42/20
2020/0178415 A1* 6/2020 Kim ................... H05K 7/20454
2021/0020542 A1* 1/2021 Kumura ................ H10W 40/77
2021/0161039 A1* 5/2021 Jung .................. H05K 7/20445
2023/0156989 A1* 5/2023 Lee ...................... H05K 9/0024
361/818
2025/0081422 A1* 3/2025 Lee .................... H05K 7/20454
2026/0075769 A1* 3/2026 Ahn ...................... H04M 1/026
2026/0089902 A1* 3/2026 Kwon ....................... G06F 1/20
2026/0101488 A1* 4/2026 Lee .................... H05K 7/20445

FOREIGN PATENT DOCUMENTS

KR 10-2016-0045336 4/2016
KR 10-2018-0126849 11/2018
KR 10-2019-0060180 6/2019
KR 10-2019-0098606 8/2019
KR 10-2021-0029545 3/2021
KR 102398672 B1 5/2022
KR 10-2023-0039215 3/2023

* cited by examiner

ELECTRONIC DEVICE COMPRISING HEAT DISSIPATION STRUCTURE PROVIDING HEAT TRANSFER PATH

CROSS-REFERENCE TO RELATED APPLICATIONS

This application is a continuation of International Application No. PCT/KR2024/006856 designating the United States, filed on May 21, 2024, in the Korean Intellectual Property Receiving Office and claiming priority to Korean Patent Application Nos. 10-2023-0120743, filed on Sep. 11, 2023, and 10-2023-0131213, filed on Sep. 27, 2023, in the Korean Intellectual Property Office, the disclosures of each of which are incorporated by reference herein in their entireties.

BACKGROUND

Field

The present disclosure relates to a heat dissipation structure providing a heat transfer path.

Description of Related Art

Electronic components mounted inside an electronic device may generate heat during operation of the electronic device. In order to lower a temperature of the electronic component raised by the generated heat, a heat dissipation path may be formed between the electronic component and a cooling region having a lower temperature than the temperature of the electronic component.

The above-described information may be provided as a related art for the purpose of helping to understand the present disclosure. No claim or determination is raised as to whether any of the above-described information may be applied as a prior art related to the present disclosure.

SUMMARY

An electronic device is disclosed. According to an example embodiment, the electronic device may include: an electronic component, a first shield can, a second shield can, a heat dissipation structure comprising a heat dissipating material, and a thermally conductive material. The electronic component may emit heat during operation of the electronic device. The first shield can may be configured to accommodate the component. The second shield can may be spaced apart from the first shield can. The heat dissipation structure may include a case and a thermally conductive material having viscosity. The thermally conductive material may include a first thermally conductive material, a second thermally conductive material, and a third thermally conductive material. The first thermally conductive material may be disposed in the case of the heat dissipation structure. The second thermally conductive material may extend from the first thermally conductive material to the component through the opening of the first shield can. The thermally conductive material extend from at least a portion of an inner space of the first shield can to at least a portion of an inner space of the second shield can through the heat dissipation structure. The third thermally conductive material may extend from the first thermally conductive material to the second cavity through the opening of the second shield can. The thermally conductive material may be configured to thermally connect the component to the inside of the second shield can.

An electronic device is disclosed. According to an example embodiment, the electronic device may include a board, an electronic component, a shield can, a cooling region, and a heat dissipation structure comprising a heat dissipating material. The electronic component may be disposed on the board and may emit heat during operation of the electronic device. The shield can may be disposed on the board. The shield can may surround at least a portion of the component. The shield can may include an opening region formed on a sidewall. The cooling region may be spaced apart from the shield can. The cooling region may be configured to absorb heat. The heat dissipation structure may include a thermally conductive material having viscosity. The heat dissipation structure may be disposed at least partially in the shield can through the opening region. The heat dissipation structure may extend from the shield can to the cooling region. The thermally conductive material may extend from an end of the heat dissipation structure to contact a surface of the component. The thermally conductive material may extend from another end of the heat dissipation structure and be disposed in the cooling region.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
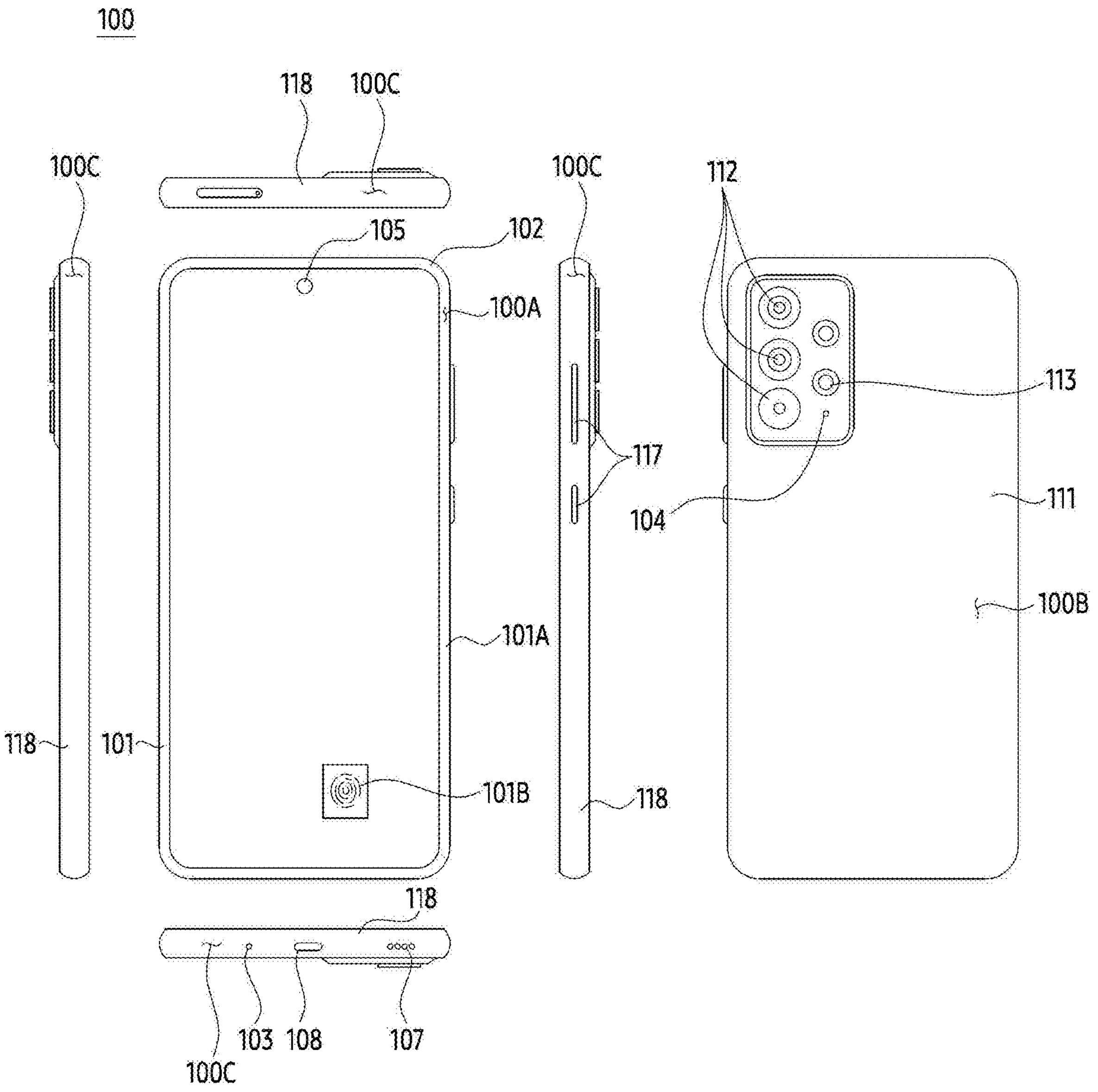
FIG. 1 is a diagram illustrating an electronic device, according to various embodiments.

FIG. 1 is a diagram illustrating an example electronic device according to various embodiments.

Referring to FIG. 1, an electronic device 100 according to an embodiment may include a housing 110 forming an exterior of the electronic device 100. For example, the housing 110 may include a first surface (or a front surface) 100A, a second surface (or a rear surface) 100C, and a third surface (or a side surface) 100B surrounding a space between the first surface 100A and the second surface 100C. In an embodiment, the housing 110 may refer to a structure (e.g., a frame structure 140 of FIG. 3) forming at least a portion of the first surface 100A, the second surface 100C, and/or the third surface 100B.

The electronic device 100 according to an embodiment may include a substantially transparent front plate 102. In an embodiment, the front plate 102 may form at least a portion of the first surface 100A. In an embodiment, the front plate 102 may include, for example, a glass plate including various coating layers or a polymer plate, but is not limited thereto.

The electronic device 100 according to an embodiment may include a substantially opaque rear plate 111. In an embodiment, the rear plate 111 may form at least a portion of the second surface 100C. In an embodiment, the rear plate 111 may be formed of coated or colored glass, ceramic, polymer, metal (e.g., aluminum, stainless steel (STS), or magnesium), or a combination of at least two of the above materials.

The electronic device 100 according to an embodiment may include a side bezel structure (or side member) 118 (e.g., a side wall 141 of a frame structure 140 of FIG. $). In an embodiment, the side bezel structure 118 may be coupled to the front plate 102 and/or the rear plate 111 to form at least a portion of the third surface 100B of the electronic device 100. For example, the side bezel structure 118 may form all of the third surface 100B of the electronic device 100, and for another example, the side bezel structure 118 may form the third surface 100B of the electronic device 100 together with the front plate 102 and/or the rear plate 111.

When the third surface 100B of the electronic device 100 is partially formed by the front plate 102 and/or the rear plate 111, the front plate 102 and/or the rear plate 111 may include a region that is bent from a periphery thereof toward the rear plate 111 and/or the front plate 102 and seamlessly extends. The extended region of the front plate 102 and/or the rear plate 111 may be positioned at both ends of, for example, a long edge of the electronic device 100, but is not limited to the above-described examples.

In an embodiment, the side bezel structure 118 may include a metal and/or a polymer. In an embodiment, the rear plate 111 and the side bezel structure 118 may be integrally formed and may include the same material (e.g., a metal material such as aluminum), but are not limited thereto. For example, the rear plate 111 and the side bezel structure 118 may be formed in separate configurations and/or may include different materials.

In an embodiment, the electronic device 100 may include at least one of a display 101, an audio module 103, 104, 107, a sensor module (not illustrated), a camera module 105, 112, 113, a key input device 117, a light emitting device (not illustrated), and/or a connector hole 108. In an embodiment, the electronic device 100 may omit at least one of the components (e.g., a key input device 117 or a light emitting device (not illustrated)), or may further include another component.

In an embodiment, the display 101 (e.g., a display module 160 of FIG. 1) may be visually exposed or visible through a substantial portion of the front plate 102. For example, at least a portion of the display 101 may be visible through the front plate 102 forming the first surface 100A. In an embodiment, the display 101 may be disposed on the rear surface of the front plate 102.

In an embodiment, the appearance of the display 101 may be formed substantially the same as the appearance of the front plate 102 adjacent to the display 101. In an embodiment, in order to expand the area in which the display 101 is visually exposed or visible, the distance between the outside of the display 101 and the outside of the front plate 102 may be formed to be generally the same.

In an embodiment, the display 101 (or the first surface 100A of the electronic device 100) may include a screen display area 101A. In an embodiment, the display 101 may provide visual information to a user through the screen display area 101A. In the illustrated embodiment, when the first surface 100A is viewed from the front, it is illustrated that the screen display area 101A is spaced apart from the outside of the first surface 100A and is positioned inside the first surface 100A, but it is not limited thereto. In an embodiment, when the first surface 100A is viewed from the front, at least a portion of the periphery of the screen display area 101A may substantially coincide with the periphery of the first surface 100A (or the front plate 102).

In an embodiment, the screen display area 101A may include a sensing area 101B configured to obtain biometric information of a user. Here, the meaning of "the screen display area 101A includes the sensing area 101B" may be understood to refer to at least a portion of the sensing area 101B may be overlapped on the screen display area 101A. For example, the sensing area 101B, like other areas of the screen display area 101A, may refer to an area in which visual information may be displayed by the display 101 and additionally biometric information (e.g., fingerprint) of a user may be obtained. In an embodiment, the sensing area 101B may be formed in the key input device 117.

In an embodiment, the display 101 may include an area in which the first camera module 105 (e.g., a camera module 1280 of FIG. 12) is positioned. In an embodiment, an opening may be formed in the area of the display 101, and the first camera module 105 (e.g., a punch hole camera) may be at least partially disposed in the opening to face the first surface 100A. In this case, the screen display area 101A may surround at least a portion of the periphery of the opening. In an embodiment, the first camera module 105 (e.g., an under display camera (UDC)) may be disposed under the display 101 to overlap the area of the display 101. In this case, the display 101 may provide visual information to the user through the area, and additionally, the first camera module 105 may obtain an image corresponding to a direction facing the first surface 100A through the area of the display 101.

In an embodiment, the display 101 may be coupled to or disposed adjacent to a touch sensing circuit, a pressure sensor capable of measuring the intensity (pressure) of the touch, and/or a digitizer that detects a magnetic field type stylus pen.

In an embodiment, the audio modules 103, 104 and 107 (e.g., an audio module 170 of FIG. 1) may include microphone holes 103 and 104 and a speaker hole 107.

In an embodiment, the microphone holes 103 and 104 may include a first microphone hole 103 formed in a partial area of the third surface 100B and a second microphone hole 104 formed in a partial area of the second surface 100C. A microphone (not illustrated) for obtaining an external sound may be disposed inside the microphone holes 103 and 104. The microphone may include a plurality of microphones to detect the direction of sound.

In an embodiment, the second microphone hole 104 formed in a partial area of the second surface 100C may be disposed adjacent to the camera modules 105, 112 and 113. For example, the second microphone hole 104 may obtain sound according to operations of the camera modules 105, 112, and 113. However, it is not limited thereto.

In an embodiment, the speaker hole 107 may include an external speaker hole 107 and a receiver hole (not illustrated) for a call. The external speaker hole 107 may be formed on a portion of the third surface 100B of the electronic device 100. In an embodiment, the external speaker hole 107 may be implemented as one hole with the microphone hole 103. Although not illustrated, a receiver hole (not illustrated) for a call may be formed on another portion of the third surface 100B. For example, the receiver hole for a call may be formed on the opposite side of the external speaker hole 107 on the third surface 100B. For example, based on the illustration of FIG. 1, the external speaker hole 107 may be formed on the third surface 100B corresponding to the lower end of the electronic device 100, and the receiver hole for a call may be formed on the third surface 100B corresponding to the upper end of the electronic device 100. However, the present disclosure is not limited thereto, and in an embodiment, the receiver hole for a call may be formed at a position other than the third surface 100B. For example, the receiver hole for a call may be formed by a space spaced apart between the front plate 102 (or display 101) and the side bezel structure 118.

In an embodiment, the electronic device 100 may include at least one speaker (not illustrated) configured to output sound to the outside of the housing 110 through an external speaker hole 107 and/or a receiver hole (not illustrated) for a call.

In an embodiment, the sensor module (not illustrated) (e.g., a sensor module 1276 of FIG. 12) may generate an electrical signal or data value corresponding to an internal operating state or an external environmental state of the electronic device 100. For example, the sensor module may include at least one of a proximity sensor, an HRM sensor, a fingerprint sensor, a gesture sensor, a gyro sensor, a pressure sensor, a magnetic sensor, an acceleration sensor, a grip sensor, a color sensor, an infrared (IR) sensor, a biometric sensor, a temperature sensor, a humidity sensor, and an illumination sensor.

In an embodiment, the camera modules 105, 112 and 213 (e.g., a camera module 1280 of FIG. 12) may include a first camera module 105 disposed to face the first surface 100A of the electronic device 100, a second camera module 112 disposed to face the second surface 100C, and a flash 113.

In an embodiment, the second camera module 112 may include a plurality of cameras (e.g., a dual camera, a triple camera, or a quad camera). However, the second camera module 112 is not necessarily limited to including a plurality of cameras, and may include one camera.

In an embodiment, the first camera module 105 and the second camera module 112 may include one or a plurality of lenses, an image sensor, and/or an image signal processor.

In an embodiment, the flash 113 may include, for example, a light emitting diode or a xenon lamp. In an embodiment, two or more lenses (infrared camera, wide-angle and telephoto lens) and image sensors may be disposed on one side of electronic device 100.

In an embodiment, the key input device 117 (e.g., an input module 1150 of FIG. 12) may be disposed on the third surface 100B of the electronic device 100. In an embodiment, the electronic device 100 may not include some or all of the key input devices 117, and the not included key input device 117 may be implemented on the display 101 in another form such as a soft key.

In an embodiment, the connector hole 108 may be formed on the third surface 100B of the electronic device 100 to accommodate the connector of the external device. A connection terminal (e.g., a connection terminal 1278 of FIG. 12) electrically connected to the connector of the external device may be disposed in the connector hole 108. The electronic device 100 according to an embodiment may include an interface module (e.g., an interface 1277 of FIG. 12) for processing electrical signals transmitted and received through the connection terminal.

In an embodiment, the electronic device 100 may include a light emitting device (not illustrated). For example, the light emitting device (not illustrated) may be disposed on the first surface 100A of the housing 110. The light emitting device (not illustrated) may provide state information of the electronic device 100 in a form of light. In an embodiment, the light emitting device (not illustrated) may provide a light source when the first camera module 105 is operated. For example, the light emitting device (not illustrated) may include an LED, an IR LED, and/or a xenon lamp.

Figure 2:
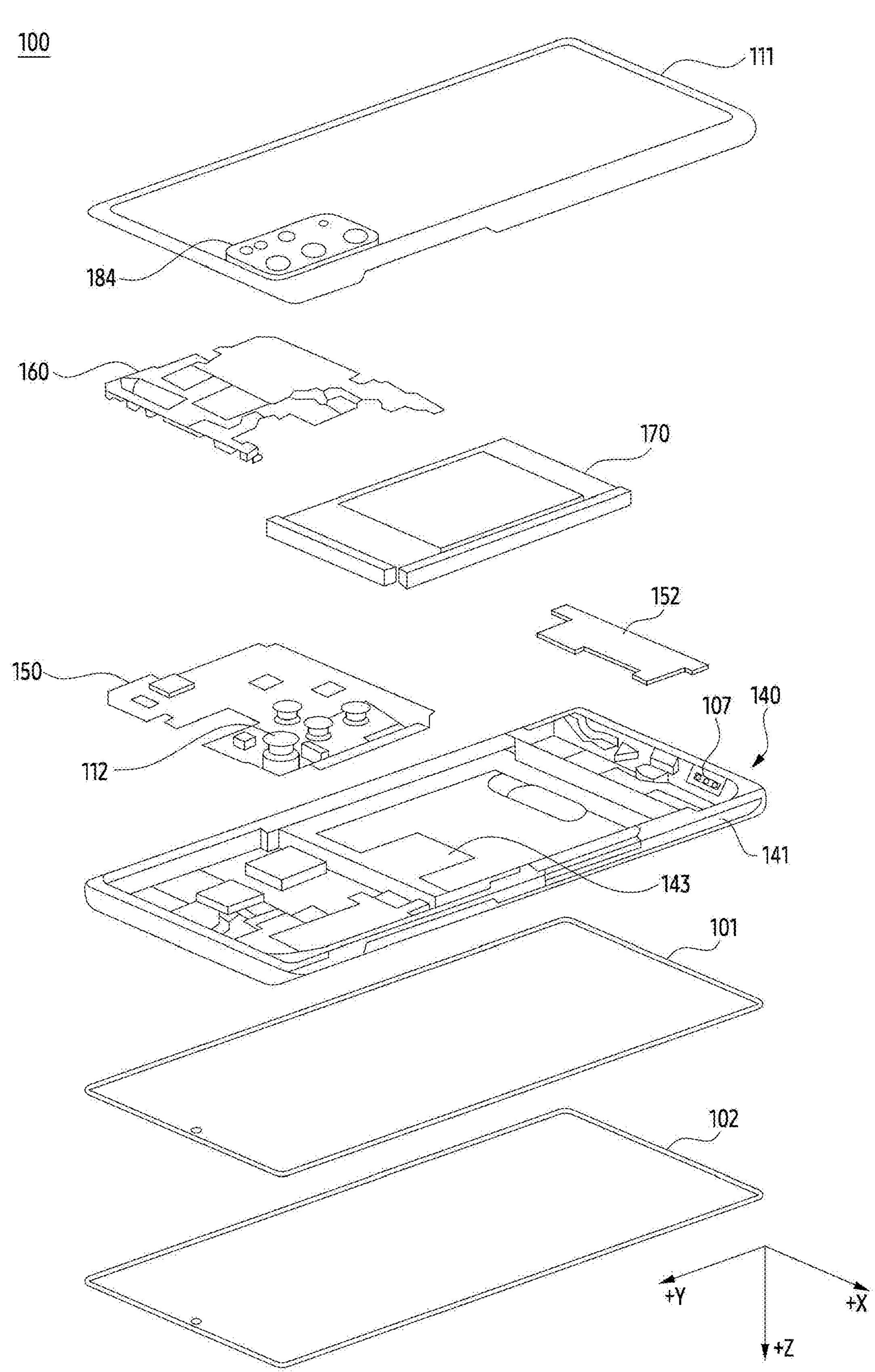
FIG. 2 is an exploded perspective view of an electronic device, according to various embodiments.

FIG. 2 is an exploded perspective view of an electronic device according to various embodiments.

Hereinafter, overlapping descriptions of components having the same reference numerals as those of the above-described components may not be repeated.

Referring to FIG. 2, the electronic device 100 according to an embodiment may include a frame structure 140, a first printed circuit board 150, a second printed circuit board 152, a cover plate 160, and a battery 170.

In an embodiment, the frame structure 140 may include a sidewall 141 forming an exterior (e.g., the third surface 100B of FIG. 2) of the electronic device 100 and a support portion 143 extending inward from the sidewall 141. In an embodiment, the frame structure 140 may be disposed between the display 101 and the rear plate 111. In an embodiment, the sidewall 141 of the frame structure 140 may surround a space between the rear plate 111 and the front plate 102 (and/or the display 101), and the support portion 143 of the frame structure 140 may extend from the sidewall 141 within the space.

In an embodiment, the frame structure 140 may support or accommodate other components included in the electronic device 100. For example, the display 101 may be disposed on one surface of the frame structure 140 facing one direction (e.g., the +z direction), and the display 101 may be supported by the support portion 143 of the frame structure 140. For another example, a first printed circuit board 150, a second printed circuit board 152, a battery 170, and a second camera module 112 may be disposed on the other surface facing a direction opposite to the one direction (e.g., the −z direction) of the frame structure 140. The first printed circuit board 150, the second printed circuit board 152, the battery 170, and the second camera module 112 may be mounted on a recess defined by the sidewall 141 and/or the support portion 143 of the frame structure 140.

In an embodiment, the first printed circuit board 150, the second printed circuit board 152, and the battery 170 may be coupled to the frame structure 140, respectively. For example, the first printed circuit board 150 and the second printed circuit board 152 may be fixedly disposed in the frame structure 140 through a coupling member such as a screw. For example, the battery 170 may be fixedly disposed on the frame structure 140 through an adhesive member (e.g., a double-sided tape). However, it is not limited by the above-described example.

In an embodiment, a cover plate 160 may be disposed between the first printed circuit board 150 and the rear plate 111. In an embodiment, the cover plate 160 may be disposed on the first printed circuit board 150. For example, the cover plate 160 may be disposed on a surface facing the −z direction of the first printed circuit board 150.

In an embodiment, the cover plate 160 may at least partially overlap the first printed circuit board 150 with respect to the z-axis. In an embodiment, the cover plate 160 may cover at least a partial area of the first printed circuit board 150. Through this, the cover plate 160 may protect the first printed circuit board 150 from physical impact or prevent or inhibit the connector coupled to the first printed circuit board 150 from being separated.

In an embodiment, the cover plate 160 may be fixedly disposed on the first printed circuit board 150 through a coupling member (e.g., a screw), or may be coupled to the frame structure 140 together with the first printed circuit board 150 through the coupling member.

In an embodiment, the display 101 may be disposed between the frame structure 140 and the front plate 102. For example, a front plate 102 may be disposed on one side (e.g., a +z direction) of the display 101 and a frame structure 140 may be disposed on the other side (e.g., a −z direction).

In an embodiment, the front plate 102 may be coupled to the display 101. For example, the front plate 102 and the display 101 may adhere to each other through an optical adhesive member (e.g., optically clear adhesive (OCA) or optically clear resin (OCR)) interposed therebetween.

In an embodiment, the front plate 102 may be coupled to the frame structure 140. For example, the front plate 102 may include an outside portion extending outside the display 101 when viewed in the z-axis direction, and may adhere to the frame structure 140 through an adhesive member (e.g., a double-sided tape) disposed between the outside portion of the front plate 102 and the frame structure 140 (e.g., the sidewall 141). However, it is not limited by the above-described example.

Figure 12:
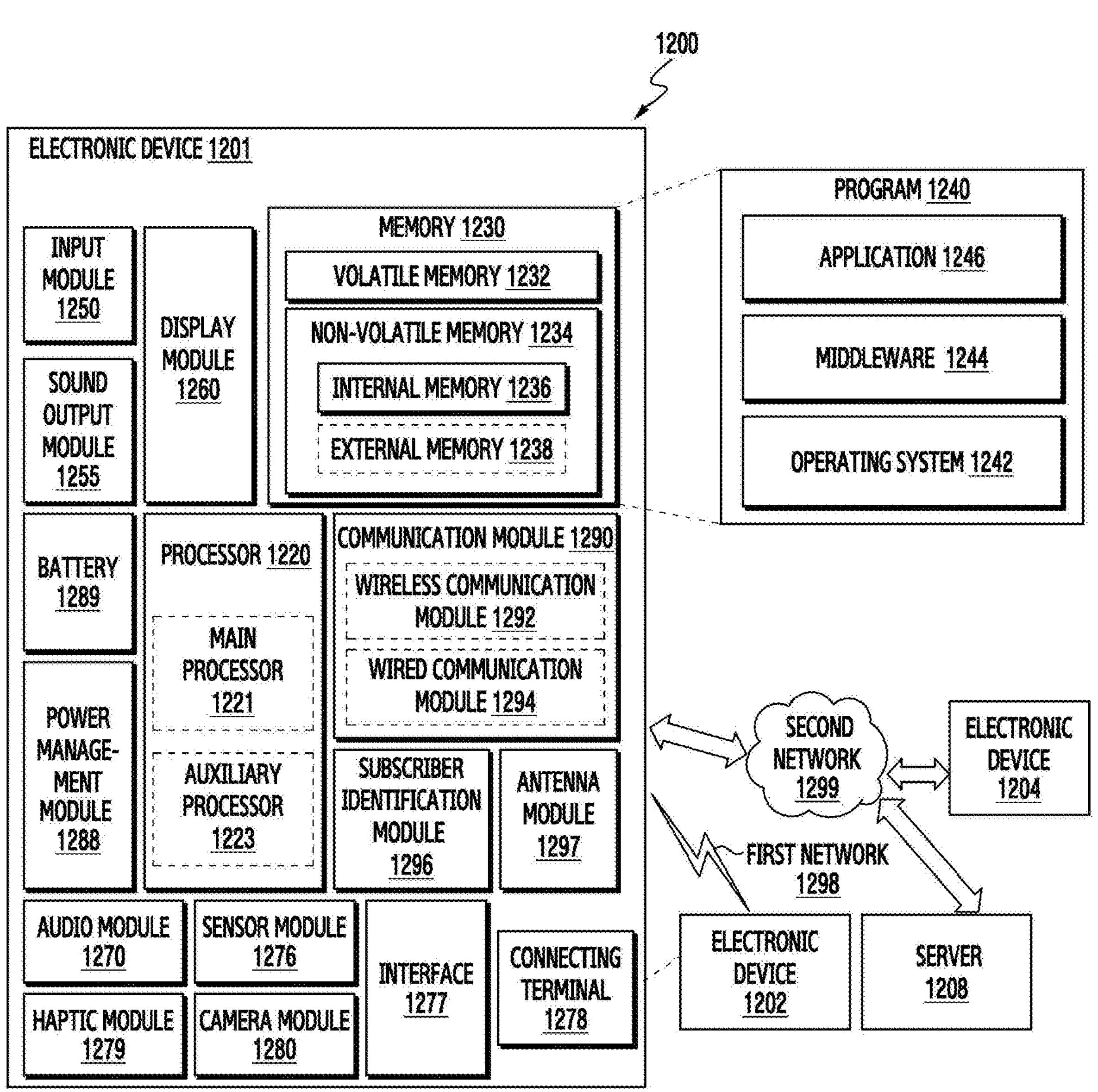
FIG. 12 is a block diagram illustrating an example electronic device in a network environment according to various embodiments.

In an embodiment, the first printed circuit board 150 and/or the second printed circuit board 152 may be equipped with a processor (e.g., a processor 1220 of FIG. 12), a memory (e.g., a memory 1230 of FIG. 12), and/or an interface (e.g., an interface 1277 of FIG. 12). The processor may include, for example, one or more of a central processing unit, an application processor, a graphic processing unit, an image signal processor, a sensor hub processor, or a communication processor. The memory may include, for example, a volatile memory or a nonvolatile memory. The interface may include, for example, a high definition multimedia interface (HDMI), a universal serial bus (USB) interface, an SD card interface, and/or an audio interface. The interface may electrically or physically connect the electronic device 100 to an external electronic device, and may include a USB connector, an SD card/MMC connector, or an audio connector. In an embodiment, the first printed circuit board 150 and the second printed circuit board 152 may be operatively or electrically connected to each other through a connection member (e.g., a flexible printed circuit board).

In an embodiment, the battery 170 may supply power to at least one component of the electronic device 100. For example, the battery 170 may include a rechargeable secondary cell or a fuel cell. At least a portion of the battery 170 may be disposed on substantially the same plane as the first printed circuit board 150 and/or the second printed circuit board 152.

The electronic device 100 according to an embodiment may include an antenna module (not illustrated) (e.g., an antenna module 1297 of FIG. 12). In an embodiment, the antenna module may be disposed between the rear plate 111 and the battery 170. The antenna module may include, for example, a near field communication (NFC) antenna, a wireless charging antenna, and/or a magnetic secure transmission (MST) antenna. The antenna module, for example, may perform short-range communication with an external device, or wirelessly transmit and receive power to and from the external device.

In an embodiment, the first camera module 105 (e.g., a front camera) may be disposed in at least a portion (e.g., a support portion 143) of the frame structure 140 so that the lens may receive external light through a partial area (e.g., a camera area 137 of FIG. 2) of the front plate 102.

In an embodiment, the second camera module 112 (e.g., a rear camera) may be disposed between the frame structure 140 and the rear plate 111. In an embodiment, the second camera module 112 may be electrically connected to the first printed circuit board 150 through a connection member (e.g., a connector). In an embodiment, the second camera module 112 may be disposed such that the lens may receive external light through a camera area 184 of the rear plate 111 of the electronic device 100.

In an embodiment, the camera area 184 may be formed on the surface (e.g., a rear surface 100C of FIG. 1) of the rear plate 111. In an embodiment, the camera area 184 may be formed to be at least partially transparent so that external light may be incident to the lens of the second camera module 112. In an embodiment, at least a portion of the camera area 184 may protrude from the surface of the rear plate 111 to a predetermined height. However, it is not limited to thereto, and in an embodiment, the camera area 184 may form a plane substantially the same as the surface of the rear plate 111.

In an embodiment, the housing 110 of the electronic device 100 may refer, for example, to a configuration or structure forming at least a portion of the exterior of the electronic device 100. In this regard, at least a portion of the front plate 102, the frame structure 140, and/or the rear plate 111 forming the exterior of the electronic device 100 may be referred to as the housing 110 of the electronic device 100.

Figure 3:
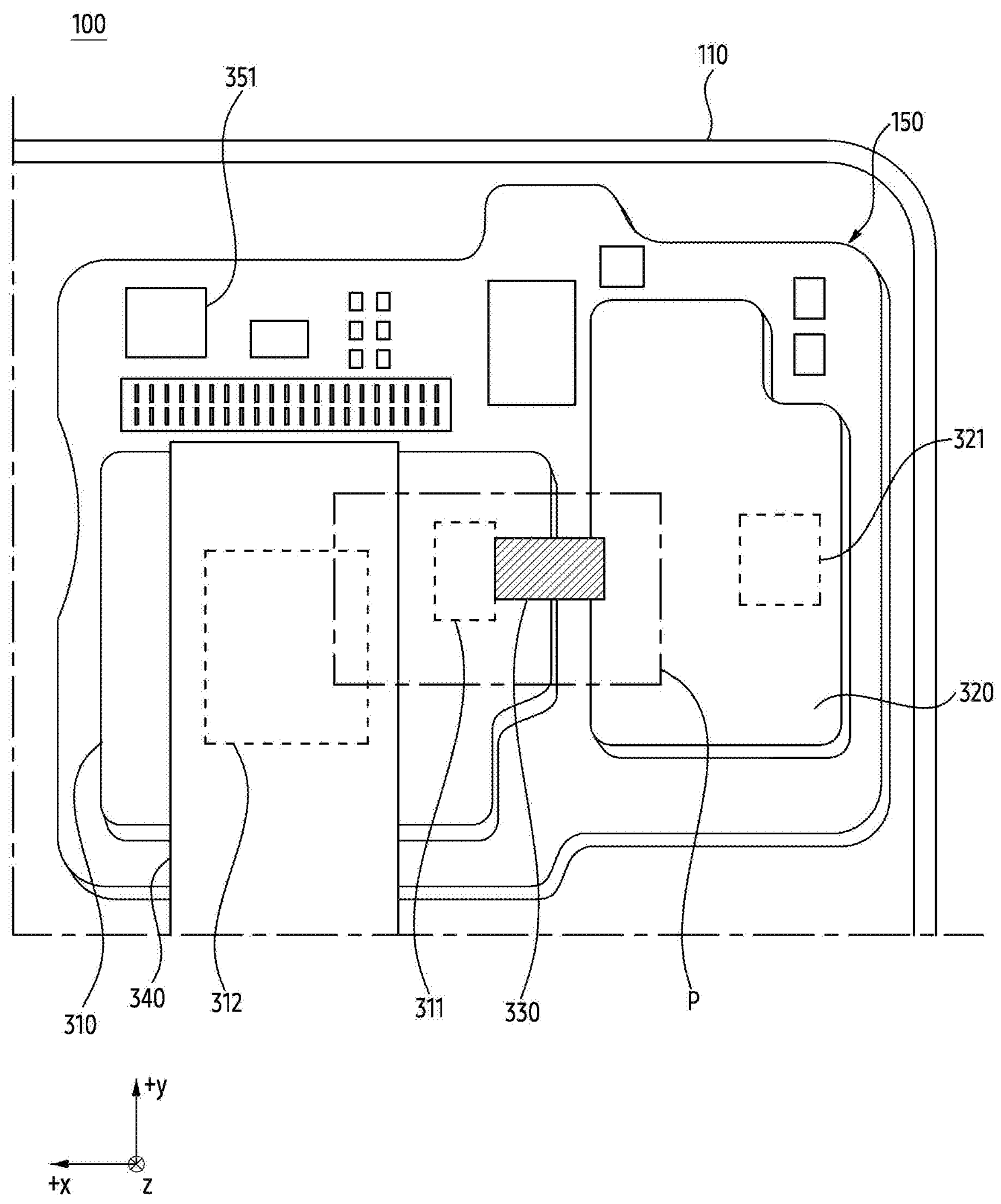
FIG. 3 is a diagram illustrating a printed circuit board in an example electronic device according to various embodiments.

FIG. 3 is a diagram illustrating a printed circuit board in an example electronic device according to various embodiments.

An electronic device 100 may include a heat transfer system that dissipates heat generated (or emitted) from a heating component of the electronic device 100 to the outside. In the electronic device 100, the heat transfer system may thermally connect the heating component and a structure of the electronic device to diffuse heat through the structure. The structure may include a surface region for dissipating heat. For example, the heating component may be an integrated circuit (IC) such as a processor or chip, and the structure may be a component (e.g., a frame, bracket, or case) that forms an exterior of the electronic device or supports an internal component.

The heat transfer system may diffuse heat generated from the heating component to the structure through a heat dissipation structure. The heat dissipation structure may provide a heat diffusion path from the heating component to the structure.

Since the electronic device 100 includes many high-performance components, the electronic device 100 may include a plurality of heat dissipation structures 330 and 340 to separate the heat diffusion path between heating components.

Referring to FIG. 3, the electronic device 100 may include a printed circuit board 150 disposed in a housing 110.

The electronic device 100 may further include components (e.g., electronic components) 311, 312, 321, and 351, a first shield can 310, a second shield can 320, and a heat dissipation structure 330. In order to miniaturize the electronic device 100 and implement multiple functions, many components 311, 312, 321, and 351 may be disposed on the printed circuit board 150. The electronic device 100 may further include shield cans 310 and 320 for noise shielding between the components 311, 312, 321, and 351. The components 311, 312, 321, and 351, the first shield can 310, and the second shield can 320 may be disposed on the printed circuit board 150. The heat dissipation structure 330 may be supported by the first shield can 310 and the second shield can 320. For example, an end of the heat dissipation structure 330 may be connected to the first shield can 310, and another end of the heat dissipation structure 330 may be connected to the second shield can 320.

The components 311, 312, 321, and 351 may emit or generate heat during operation of the electronic device 100. For example, during operation of the electronic device 100, the components 311, 312, 321, and 351 may generate heat, and emit the generated heat. A portion of the components 311, 312, 321, and 351 may be disposed in the shield cans 310 and 320. For example, the first component 311 and the second component 312 may be disposed in a space in the first shield can 310. The third component 321 may be disposed in a space in the second shield can 320. The first component 311 and the second component 312 may emit or generate more heat than the other component 351. For example, the first component 311 and the second component 312 may be an integrated circuit (IC), a chip, a heating component, an application processor (AP), a communication processor (CP), or a power management integrated circuit (PMIC). The component 351 may assist operation of the components 311, 312, and 321. The component 351 may be a device disposed outside the shield cans 310 and 320. For example, the component 351 may be at least one of a capacitor, an inductor, or a resistor.

For example, the component 351 may be disposed around the first component 311. Passive elements such as a resistor, a capacitor, or an inductor may be disposed around a high-performance component such as the first component 311. A component that emits a lot of heat, such as the first component 311 or the second component 312, may be located outside the printed circuit board 150 or outside a space surrounded by the shield can 310. For example, the first component 311 or the second component 312 may be disposed adjacent to a sidewall of the shield can 310 within an internal space defined by the shield can 310.

The first shield can 310 may surround a portion of the components disposed on the printed circuit board 150. For example, the first shield can 310 may provide a space capable of accommodating at least one component. For example, the first shield can 310 may provide a space in which the first component 311 and the second component 312 are disposed. The first shield can 310 may surround the first component 311 and the second component 312. The second shield can 320 may surround other components among the components disposed on the printed circuit board 150. For example, the second shield can 320 may provide a space in which the third component 321 is disposed. The second shield can 320 may surround the third component 321.

The first shield can 310 and the second shield can 320 may include a metal material. The first shield can 310 and the second shield can 320 may be formed of a metal plate. The first shield can 310 and the second shield can 320 may be metal cases formed from the metal plate through a press process with an internal space. The first shield can 310 and/or the second shield can 320 may include a Nickel-Silver (or Nickel-Brass) material, a copper alloy, and/or stainless steel. The first shield can 310 and the second shield can 320 formed of a metal material may prevent or reduce an external noise signal or electromagnetic wave from being transmitted inside the first shield can 310 and the second shield can 320, and the first shield can 310 and the second shield can 320 may prevent or reduce electromagnetic wave generated by the components 311, 312, and 321 inside the first shield can 310 and the second shield can 320 from being transmitted outside the first shield can 310 or the outside of the second shield can 320. For example, the first shield can 310 and the second shield can 320 may block noise transmitted from external components to provide stable operation of components within the shield can. The first shield can 310 may block electromagnetic wave according to operation of other components 321 and 351 from being transmitted into the first shield can 310 in order for operation of the first component 311 and the second component 312 disposed in an internal space of the first shield can 310. The second shield can 320 may block electromagnetic wave according to operation of other components 311, 312, and 351 from being transmitted into the second shield can 320, in order for operation of the third component 321 disposed in an internal space of the second shield can 320.

The electronic device 100 may further include a heat dissipation material, a heat transfer structure, or a heat dissipation structure to provide a diffusion path for heat generated from the components 311, 312, and 321. For example, the electronic device 100 may include a first heat dissipation structure 330 for the component 311 and/or a heat dissipation structure 340 for the second component 312. Heat generated from the first component 311 and the second component 312 may be transmitted through independent paths, respectively. The heat dissipation structure 330 for the first component 311 may connect the shield cans 310 and 320. For example, an end of the heat dissipation structure 330 may be connected to the first shield can 310, and another end of the heat dissipation structure 330 may be connected to the second shield can 320. The heat dissipation structure 330 may include a thermally conductive material or a heat dissipation material therein. The thermally conductive material may be a liquid or gel mixed with particles having high thermal conductivity. The thermally conductive material may have viscosity. For example, the thermally conductive material may include thermal grease. The heat dissipation structure 330 may be thermally connected to the first component 311 within the first shield can 310. The heat dissipation structure 330 may be thermally connected to the inside of the second shield can 320. The heat dissipation structure 330 may diffuse heat generated from the first component 311 to the inside of the second shield can 320.

The heat dissipation structure 340 may be thermally connected to the second component 312 within the first shield can 310. The heat dissipation structure 340 may be thermally connected to a cooling region within the electronic device 100. The cooling region may include at least one of the housing 110 of the electronic device 100, a portion (e.g., the support portion 143 of FIG. 2) of a frame structure (e.g., the frame structure 140 of FIG. 1) or a region with few or no components generating heat. The heat dissipation structure 340 may be thermally connected to the second component 312 through a heat dissipation material (e.g., thermal grease, thermal interface material (TIM), or nano TIM). The heat dissipation structure 340 may include one of a plate (e.g., a graphite sheet) with a thermally conductive material, a metal plate, a structure (e.g., a heat pipe) including a phase shift material therein, or a vapor chamber. The heat dissipation structure 340 may transfer heat generated from the second component 312 to the cooling region to diffuse the heat outside the electronic device 100. The first component 311 and the second component 312 in the first shield can 310 may separate the heat dissipation path. Due to the separated heat dissipation path, the influence of heat between the first component 311 and the second component 312 may be reduced.

When the first component 311 is disposed adjacent to a side surface of the first shield can 310 and a space for applying the heat dissipation structure is insufficient, heat dissipation through a heat pipe or a metal plate, such as a heat dissipation structure 340 for the second structure 340, may be difficult. As a thermally conductive material extending from the heat dissipation structure 330 including a thermally conductive material (liquid TIM) therein is in contact with the first component 311, the first component 311 of the electronic device 100 may diffuse the generated heat to the second shield can 320.

A connection structure of the heat dissipation structure 330 and the shield cans 310 and 320 disposed in a region P and a heat diffusion path will be described in greater detail below with reference to FIGS. 4A to 10.

Figure 4A:
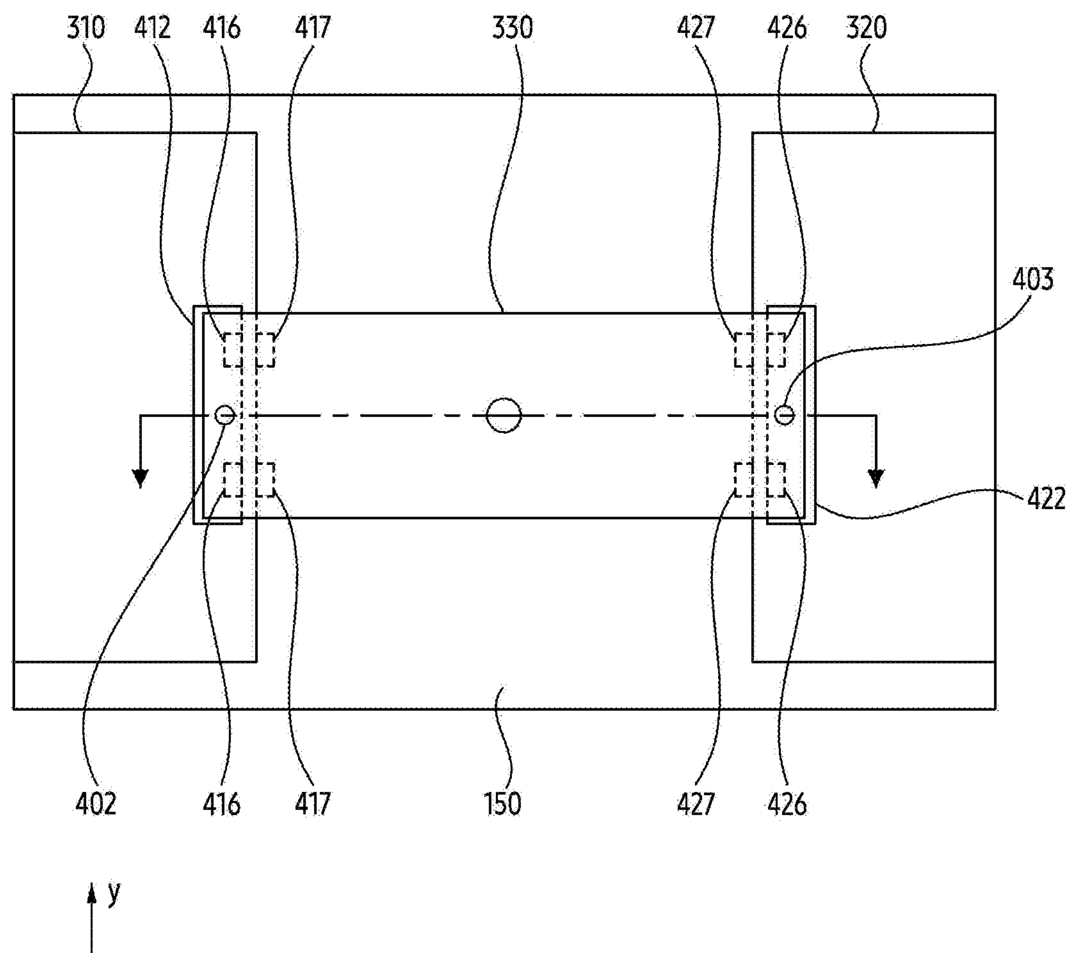
FIG. 4A is a diagram illustrating an arrangement of example shield cans and a heat dissipation structure according to various embodiments.
Figure 4B:
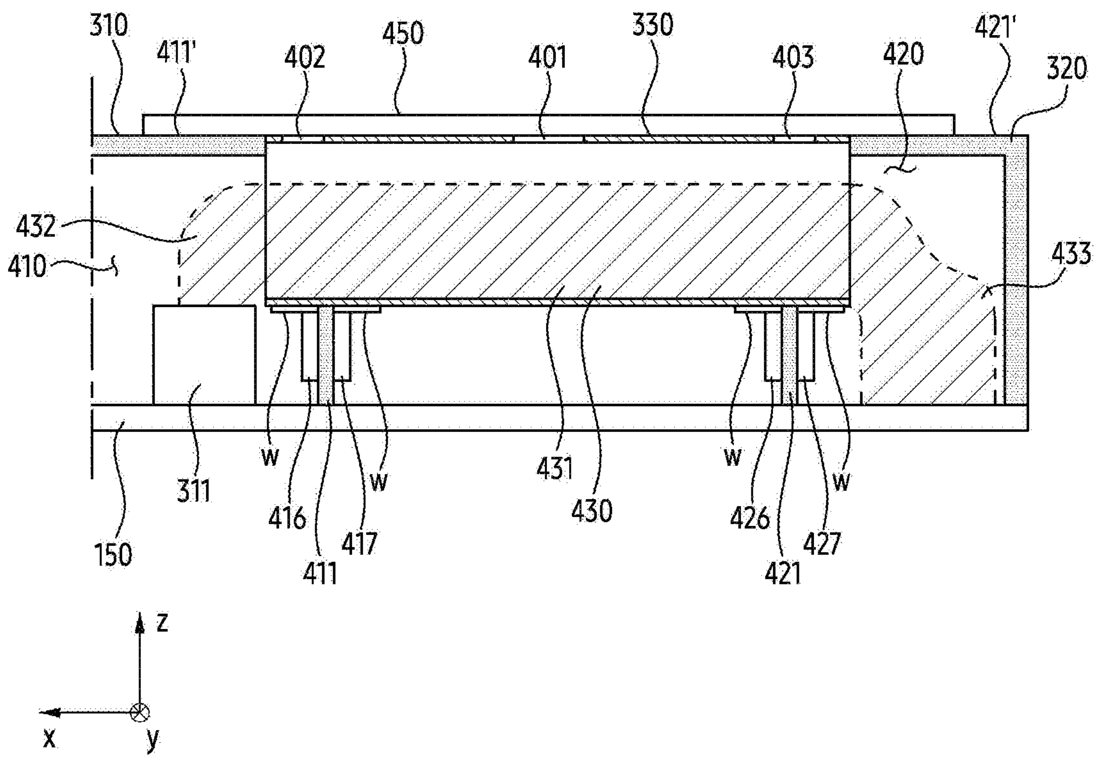
FIG. 4B is a cross-sectional view illustrating example shield cans and a heat dissipation structure according to various embodiments.

FIG. 4A is a diagram illustrating an example arrangement of example shield cans and a heat dissipation structure according to various embodiments. FIG. 4B is a cross-sectional view illustrating shield cans and a heat dissipation structure according to various embodiments.

FIG. 4A illustrates the region P of FIG. 3 in greater detail, and FIG. 4B illustrates a cross section taken along a heat dissipation structure 330 and a peripheral structure (e.g., a first shield can 310 and a second shield can 320) of FIG. 4A in greater detail. Referring to FIGS. 4A and 4B, the heat dissipation structure 330 may be disposed between the first shield can 310 and the second shield can 320. The first shield can 310 may provide a first cavity 410 accommodating a first component 311. For example, the first shield can 310 may surround the first component 311 and peripheral components. The first component 311 and the peripheral components may be disposed in the first cavity 410. When a space between the first shield can 310 and the first component 311 is insufficient, the first component 311 adjacent to a side surface 411 (or sidewall) of the first shield can 310 may be difficult to connect to a heat dissipation structure (e.g., the heat dissipation structure 340 of FIG. 3) connected to a second component (e.g., the second component 312 of FIG. 3). In order to diffuse the heat generated from the first component 311, the heat dissipation structure 330 may be connected to the first component 311, and the heat dissipation structure 330 may be connected to the second shield can 320. The heat dissipation structure 330 may transfer heat generated from the first component 311 to the inside of the second shield can 320. The second shield can 320 may provide a second cavity 420. For example, the second shield can 320 may surround components disposed therein (e.g., the third component 321 of FIG. 3).

The first shield can 310 may include an opening 412 to be connected to the heat dissipation structure 330, and the second shield can 320 may include an opening 422 to be connected to the heat dissipation structure 330.

The opening 412 of the first shield can 310 may be formed on at least one surface of the first shield can 310. For example, the opening 412 may be formed on a side surface 411, which is facing the second shield can 320 or close to the second shield can 320, among side surfaces of the first shield can 310. The opening 412 may be formed on the side surface 411 and an upper surface 411' of the first shield can 310 in contact with the side surface 411. As an end of the heat dissipation structure 330 is inserted into the opening 412, the heat dissipation structure 330 may be supported by the side surface 411 of the first shield can 310. The opening 412 of the first shield can 310 may be spaced apart from the first component 311. For example, the first component 311 may overlap the first shield can 310 when a surface of the first component 311 in contact with the thermally conductive material 430 is viewed in a vertical direction. A portion of the upper surface 411' of the first shield can 310 may be disposed on the first component 311.

The opening 422 of the second shield can 320 may be formed on at least one surface of the second shield can 320. For example, the opening 422 may be formed on a side surface 421, which is facing the first shield can 310 or close to the first shield can 310, among side surfaces of the second shield can 320. The opening 422 may be formed on the side surface 421 and an upper surface 421' of the second shield can 320 in contact with the side surface 421. As another end of the heat dissipation structure 330 is inserted into the opening 422, the heat dissipation structure 330 may be supported by the side surface 421 of the second shield can 320.

The heat dissipation structure 330 may further include a fastening structure to be fixed to the first shield can 310 and the second shield can 320. For example, the heat dissipation structure 330 may include a first leg set 416 and 417 to be fastened to the first shield can 310. The heat dissipation structure 330 may include a second leg set 426 and 427 to be fastened to the second shield can 320. The first leg set 416 and 417 and the second leg set 426 and 427 may restrict movement of the heat dissipation structure 330 in the x-axis direction and the y-axis direction. For example, legs 416, 417, 426, and 427 of the first leg set 416 and 417 and the second leg set 426 and 427 may extend from an outer surface of the heat dissipation structure 330 toward a printed circuit board 150. The legs 416, 417, 426, and 427 may extend in a direction perpendicular to the printed circuit board 150 and may be fixed to the side surface 411 of the first shield can 310 and the side surface 421 of the second shield can 320. For example, the first leg set 416 and 417 may be fitted to the side surface 411 of the first shield can 310. The second leg set 426 and 427 may be fitted to the side surface 421 of the second shield can 320. The heat dissipation structure 330 may be restricted from moving in a direction parallel to the printed circuit board 150, by legs 416, 417, 426, and 427 extending in a direction perpendicular to the printed circuit board 150 and fixed to the shield cans 310 and 320.

The heat dissipation structure 330 may be formed of a metal material. The heat dissipation structure 330 may be formed of the same material as the shield cans 310 and 320. For example, the heat dissipation structure 330 may include a Nickel-Silver (or Nickel-Brass) material, a copper alloy, and/or stainless steel. However, it is not limited thereto, and the heat dissipation structure 330 may be formed of a metal material different from the shield can.

The heat dissipation structure 330 may be integrally formed with the legs 416, 417, 426, and 427. For example, the legs 416, 417, 426, and 427 may be welded to the heat dissipation structure 330 in a region w.

One of the legs among the first leg set 416 and 417 may be conjunct to the heat dissipation structure 330, and one of the legs among the second leg set 426 and 427 may be conjunct to the heat dissipation structure 330. For example, the leg 417 of the first leg set 416 and 417 and the leg 426 of the second leg set 426 and 427 may be conjunct to the heat dissipation structure 330. The leg 417 and the leg 426 may be in contact with an outer surface of the first shield can 310 and an outer surface of the second shield can 320, thereby restricting movement of the heat dissipation structure 330. For another example, the leg 416 of the first leg set 416 and 417 and the leg 427 of the second leg set 426 and 427 may be conjunct to the heat dissipation structure 330. The leg 416 and the leg 427 may be in contact with an inner surface of the first shield can 310 and an inner surface of the second shield can 320, thereby restricting movement of the heat dissipation structure 330.

The heat dissipation structure 330 may include a thermally conductive material 430 occupying at least a portion of an internal space of the heat dissipation structure 330, extending from the heat dissipation structure 330 and in contact with the first component 311, and extending from the heat dissipation structure 330 and disposed in the second cavity 420 of the second shield can 320. The heat dissipation structure 330 may further include an inlet 401, a first opening 402, and a second opening 403. The inlet 401 may be an opening for supplying a thermally conductive material 430 (e.g., liquid TIM or thermal grease) into the heat dissipation structure 330. The inlet 401 may include a valve for reducing backflow of the thermally conductive material 430 introduced into the heat dissipation structure 330. The inlet 401 may be disposed between the first opening 402 and the second opening 403. The first opening 402 and the second opening 403 may be disposed at both ends of the heat dissipation structure 330. Using the first opening 402 and the second opening 403, the amount of the thermally conductive material 430 introduced through the inlet 401 may be identified. When the thermally conductive material 430 is injected through the inlet 401 and moves to both ends of the heat dissipation structure, the thermally conductive material 430 injected through the first opening 402 and the second opening 403 may be identified outside the heat dissipation structure 330. Based on the thermally conductive material 430 identified from the outside, the thermally conductive material 430 introduced into the shield cans 310 and 320 may be identified.

The thermally conductive material 430 may include a first portion 431 disposed on at least a portion of the internal space of the heat dissipation structure 330, a second portion 432 extending from an end of the heat dissipation structure 330 to at least one surface of the first component 311, and a third portion 433 extending from another end of the heat dissipation structure 330 to the second cavity 420 of the second shield can 320. The thermally conductive material 430 may be thermally connected to the first component 311. Heat generated from the first component 311 may be diffused to the second cavity 420 through the thermally conductive material 430.

The second portion 432 may be a portion where the thermally conductive material 430 introduced through the inlet 401 is in contact with a surface (e.g., upper surface) of the first component 311 through an outlet formed at an end of the heat dissipation structure 330. The third portion 433 may be a portion where the thermally conductive material 430 introduced through the inlet 401 is introduced into the second cavity 420 through an outlet formed at another end of the heat dissipation structure 330. The third portion 433 may be disposed in a component with little or no heat generation in the second cavity 420. The third portion 433 may be disposed on a surface of the printed circuit board 150, which is without components, in the second cavity 420. The third portion 433 may be in contact with a portion of the second shield can 320 to diffuse heat to the second shield can 320.

A tape 450 may be attached to a portion of an outer surface of the first shield can 310, a portion of an outer peripheral surface of the heat dissipation structure 330, and a portion of an outer surface of the second shield can 320. The tape 450 may extend along the outer surface of the first shield can 310, the outer surface of the second shield can 320, and the outer peripheral surface of the heat dissipation structure 330. The outer surface of the first shield can 310, the outer surface of the second shield can 320, and the outer peripheral surface of the heat dissipation structure 330 to which the tape 450 extends may be a substantially continuous surface. The tape 450 may be attached to the continuous surface and fix the heat dissipation structure to the first shield can and the second shield can. The tape 450 may limit movement of the heat dissipation structure 330 in the z-axis direction. The tape 450 may reduce or prevent leakage of the thermally conductive material 430 inside the heat dissipation structure 330. The tape 450 may be attached to an outer surface of the heat dissipation structure 330 to isolate the inside and the outside of the heat dissipation structure 330. For example, the tape 450 may surround the inlet 401, the first opening 402, and the second opening 403.

The tape 450 may include a conductive material. The tape 450 may be operated as a ground by the conductive material. The tape 450 operating as the ground may improve shielding performance of the first shield can 310 and the second shield can 320.

In order to strengthen the fastening force between the heat dissipation structure 330 and the first shield can 310, an adhesive may be disposed between the heat dissipation structure 330 and the opening 412 of the first shield can 310. In order to strengthen the fastening force between the heat dissipation structure 330 and the second shield can 320, an adhesive may be disposed between the heat dissipation structure 330 and the opening 422 of the second shield can 320.

According to the above-described embodiment, after being fixed to the first shield can 310 and the second shield can 320, the heat dissipation structure 330 may transfer heat dissipation materials to the first component 311 and the second cavity 420 by including the inlet 401, the first opening 402, and the second opening 403. Stable performance of the electronic device 100 may be maintained by diffusing heat generated from the component 311 to the second cavity 420 through the transferred heat dissipation material.

Figure 5A:
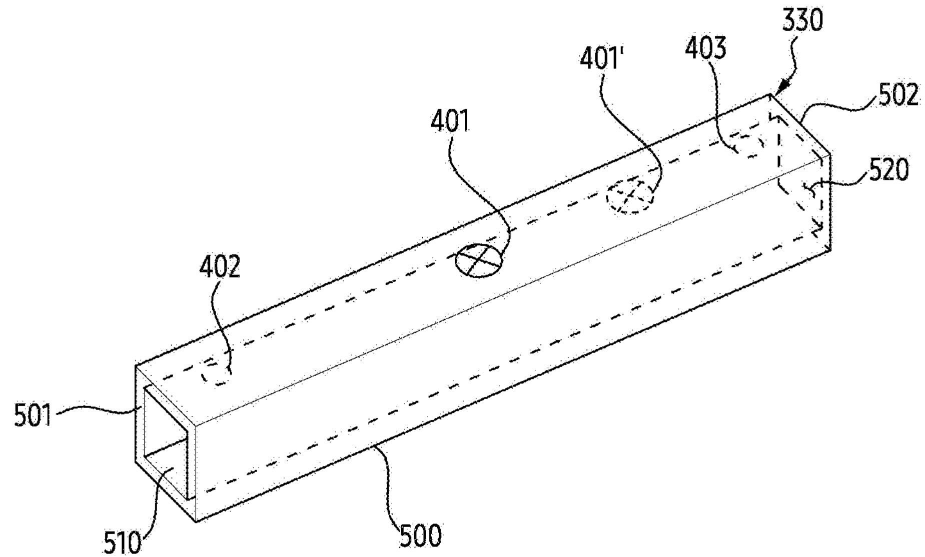
FIGS. 5A and 5B are perspective views illustrating an example heat dissipation structure according to various embodiments.
Figure 5B:
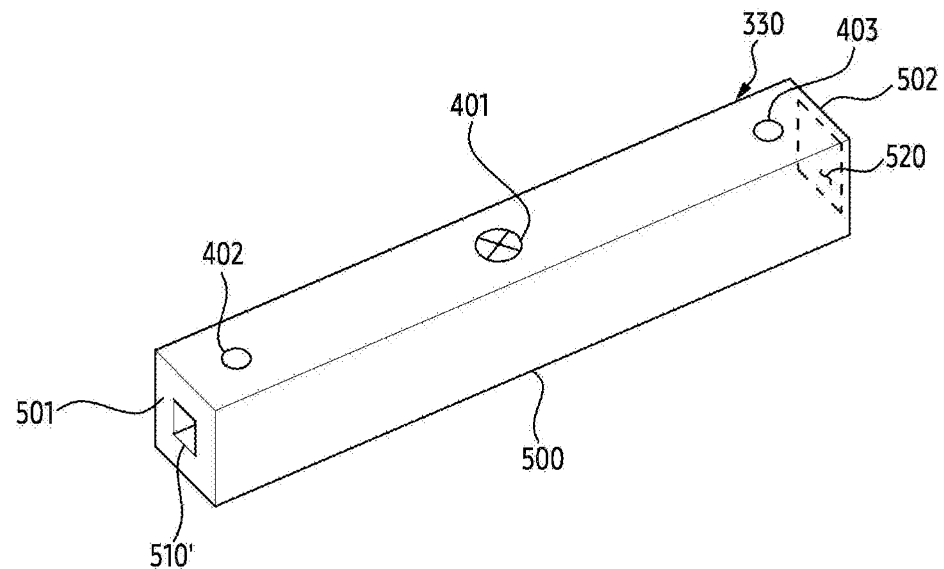

FIGS. 5A and 5B are perspective views illustrating an example heat dissipation structure according to various embodiments. Referring to FIG. 5A, a heat dissipation structure 330 may include a case 500. The case 500 may include a hollow hole. The case 500 may be a pipe with both ends open. The case 500 may provide an inflow path of a thermally conductive material (e.g., the thermally conductive material 430 of FIG. 4B) introduced through an inlet

401. For example, the case 500 may guide movement of the thermally conductive material.

A cross section of the case 500 may have a pipe shape. The pipe may be a square pipe, and may be a polygonal or circular pipe. A shape of the pipe may be determined according to an arrangement position within an electronic device (e.g., the electronic device 100 of FIG. 1) or a surrounding environment of the heat dissipation structure 330.

The heat dissipation structure 330 may include an inlet 401, a first opening 402, and/or a second opening 403 formed in an outer surface of the case 500. The inlet 401 may be disposed between the first opening 402 and the second opening 403. The inlet 401 may be a passage through which a nozzle for injection of a thermally conductive material passes. The first opening 402 and the second opening 403 may be formed on an outer surface of the case 500, in order to identify the thermally conductive material in the case 500 injected through the inlet 401. The inlet 401, the first opening 402, and the second opening 403 may face the same direction on the outer surface of the heating structure 330. For example, the inlet 401, the first opening 402, and the second opening 403 may be formed on a surface of the case 500. The inlet 401 may be formed on an upper surface of the case 500 of the heat dissipation structure 330, and the first opening 402 and the second opening 403 may be formed on the upper surface of the case 500 in which the inlet 401 is formed. For example, when the case 500 is circular, the first opening 402 and the second opening 403 may be arranged to face a direction parallel to a direction in which the inlet 401 faces.

The heat dissipation structure 330 may further include a first outlet 510 and a second outlet 520. The first outlet 510 may be formed at an end 501 of the heat dissipation structure 330. The second outlet 520 may be formed at another end 502 of the heat dissipation structure 330. The first outlet 510 and the second outlet 520 may move a thermally conductive material introduced from the inlet 401 to the outside of the case 500. For example, through the first outlet 510, a part of the thermally conductive material in the case 500 may be moved to a first shield can (e.g., the first shield can 310 of FIG. 3). Through the second outlet 520, another part of the thermally conductive material in the case 500 may be moved to a second shield can (e.g., the second shield can 320 of FIG. 3). The first outlet 510 may be formed at one end 501 of the case 500 (or the heat dissipation structure 330). The second outlet 520 may be formed at another end 502 of the case 500 (or the heat dissipation structure 330). For example, the first outlet 510 and the second outlet 520 may be open portions located at both ends 501 and 502 of the hollow hole. The first outlet 510 may connect the inside of the case 500 to a first cavity 410 of the first shield can 310. The second outlet 520 may connect the inside of the case 500 to a second cavity 420 of the second shield can 320. The amount of thermally conductive material introduced into the first shield can 310 may be different from the amount of thermally conductive material introduced into the second shield can 320. For example, the amount of thermally conductive material passing through the first outlet 510 may be different from the amount of thermally conductive material passing through the second outlet 520. Areas of the first outlet 510 and the second outlet 520 may be the same. For example, a cross-sectional area of the case 500 in pipe-shaped may be substantially the same at a plurality of points. Pipes with the same internal cross-sectional area may transfer the thermally conductive material at the same speed (or in the same amount). In order to differentiate the amount of thermally conductive material transferred from the first outlet 510 and the second outlet 520, the inlet 401 may be disposed to be biased to one of both ends of the heat dissipation structure 330. For example, the heat dissipation structure 330 may include an inlet 401' closer to the second outlet 520 than the first outlet 510, instead of the inlet 401, as illustrated in FIG. 5A. The inlet 401' may be disposed closer to the other end 502 of the heat dissipation structure 330 than the end 501 of the heat dissipation structure 330.

The amount of thermally conductive material that is injected through the inlet 401 spaced substantially the same distance from the end 501 of the heat dissipation structure 330 and the other end 502 of the heat dissipation structure 330 and transferred to the first shield can 310 through the first outlet 510 may be substantially the same as the amount of thermally conductive material transferred to the second shield can 320 through the second outlet 520. The amount of thermally conductive material injected through the inlet 401' and transferred to the first shield can 310 through the first outlet 510 may be less than the amount of thermally conductive material transferred to the second shield can 310 through the second outlet 520.

The heat dissipation structure 330 may include outlets 510' and 520 having different areas, as illustrated in FIG. 5B. For example, the first outlet 510' disposed at the end 501 of the heat dissipation structure 330 may be narrower than the second outlet 520 disposed at the other end 502 of the heat dissipation structure 330. The area of the first outlet 510' may be smaller than the area of the second outlet 520. The amount of thermally conductive material transferred to the first shield can 310 through the relatively narrow first outlet 510' may be less than the amount of thermally conductive material transferred to the second shield can 320 through the second outlet 520.

The heat dissipation structure 330 may adjust the amount of thermally conductive material transferred to the first shield can 310 and the amount of thermally conductive material transferred to the second shield can 320, by varying areas of the first outlet 510 or 510' and the second outlet 520 or arranging the inlet 401 or 401' differently.

Figure 6:
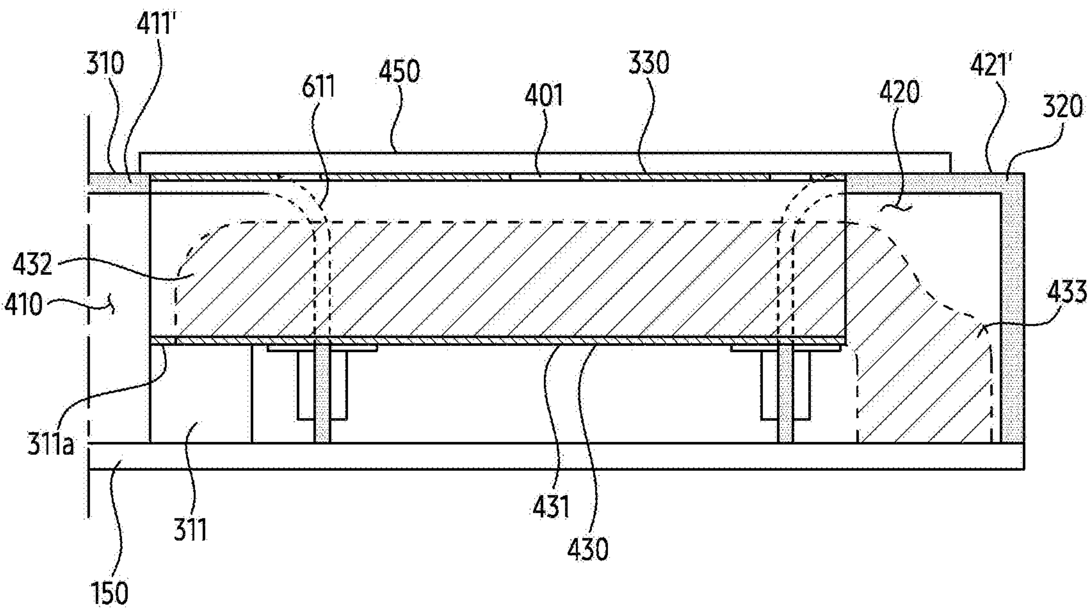
FIG. 6 is a cross-sectional view of an example shield can and a heat dissipation structure disposed on a component in the shield can according to various embodiments.
Figure 7:
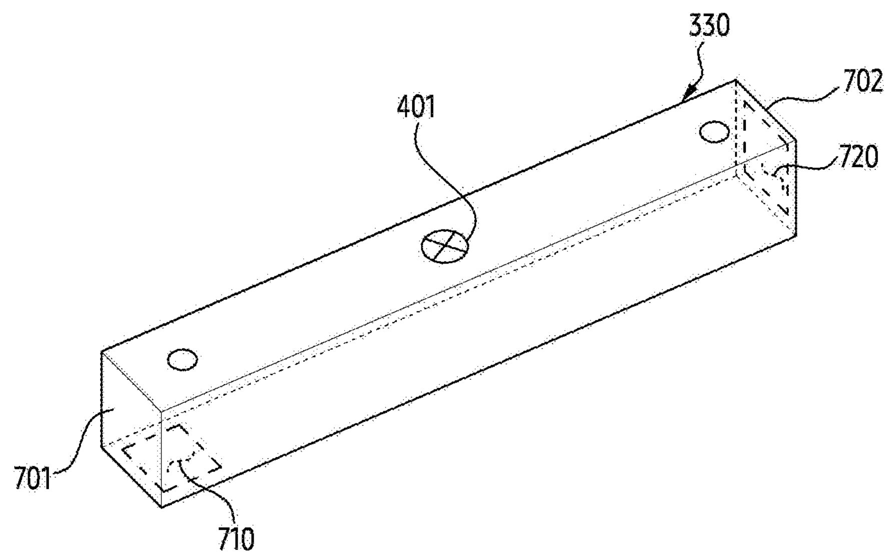
FIG. 7 is a perspective view of an example heat dissipation structure having an outlet facing a component according to various embodiments.

FIG. 6 is a cross-sectional view of an example shield can and a heat dissipation structure disposed on a component in the shield can according to various embodiments. FIG. 7 is a perspective view of an example heat dissipation structure having an outlet facing a component according to various embodiments.

Referring to FIGS. 6 and 7, a first shield can 310 may include an opening 611. The opening 611 may be formed on a side surface 411 in contact with a heat dissipation structure 330 and an upper surface 411' in contact with the side surface 411. The opening 611 may be formed such that the heat dissipation structure 330 is capable of being disposed on a first component 311. For example, a portion of the upper surface 411' of the first shield can 310 may be removed. The first component 311 may be spaced apart from the upper surface 411' of the first shield can 310, when a surface 311*a* of the first component 311 in contact with a second portion 432 of the thermally conductive material 430 is viewed in a vertical direction. A portion of the heat dissipation structure 330 disposed in a first cavity 410 of the first shield can 310 bypassing through the opening 611 of the first shield can 310 may be disposed on the first component 311.

The heat dissipation structure 330 may include a first outlet 710 facing the first component 311 and a second outlet 720 formed at another end 702 of the heat dissipation structure 330. The first outlet 710 may be disposed adjacent to an end 701 of the heat dissipation structure 330. When a surface of the first component 311 in contact with the second portion 432 is viewed in a vertical direction, the first outlet 710 of the heat dissipation structure 330 may overlap the first component 311. The first outlet 710 may be in contact with the first component 311. However, it is not limited thereto, and the first outlet 710 may be spaced apart from the first component 311.

A portion of the thermally conductive material 430 introduced through the inlet 401 of the heat dissipation structure 330 may be located inside the heat dissipation structure 330. The thermally conductive material 430 may include a first portion 431 located inside a portion of the heat dissipation structure 330, a second portion 432 contacting with the first component 311, and a third portion 433 disposed at a second cavity 420 of the second shield can 320 through the second outlet 720 formed at the other end 702 of the heat dissipation structure 330.

When the first outlet 710 of the heat dissipation structure 330 is in contact with the first component 311, the thermally conductive material 430 inside the first shield can 310 may not be transferred to the first cavity 410 of the first shield can 310 through the first outlet 710. The second portion 432 of the thermally conductive material 430 may absorb only heat generated from the first component 311, thereby rapidly diffusing the heat of the first component 311 to the second cavity 420 of the second shield can 320.

Figure 8:
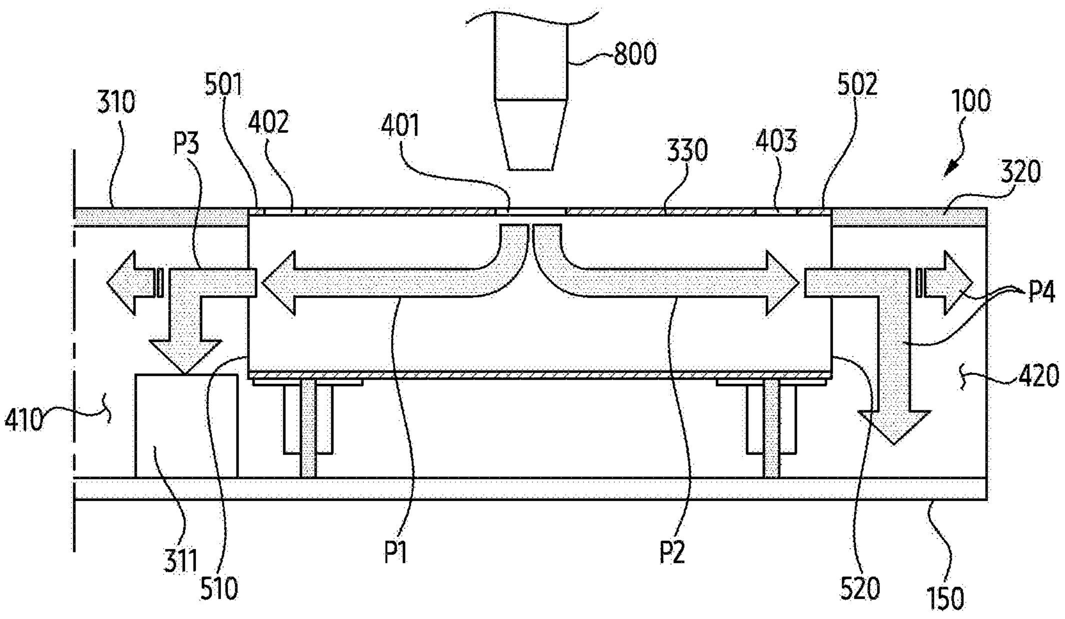
FIG. 8 is a diagram illustrating an example operation of applying a heat dissipation material transmitted through an example heat dissipation structure according to various embodiments.

FIG. 8 is a diagram illustrating an example operation of applying a heat dissipation material transferred through an example heat dissipation structure according to various embodiments.

Referring to FIG. 8, an injection nozzle 800 may supply a thermally conductive material (e.g., the thermally conductive material 430 of FIG. 4B or FIG. 6) into an electronic device 100. The injection nozzle 800 may be inserted into a heat dissipation structure 330 through an inlet 401. A thermally conductive material may be injected into the heat dissipation structure 330 through the injection nozzle 800 inserted into the heat dissipation structure 330. The inlet 401 may include a backflow-preventing valve to reduce the leakage of the injected thermally conductive material to the outside of the heat dissipation structure 330 through the inlet 401.

The thermally conductive material transferred into the heat dissipation structure 330 may be moved to both ends of the heat dissipation structure 330. For example, a portion of the thermally conductive material transferred into the heat dissipation structure 330 may be transferred to an end 501 of the heat dissipation structure 330, and another portion of the thermally conductive material transferred into the heat dissipation structure 330 may be transferred to another end 502 of the heat dissipation structure 330. A portion of the thermally conductive material in the heat dissipation structure 330 may be transferred to the end 501 of the heat dissipation structure 330 along a first path P1. A portion of the thermally conductive material transferred to the end 501 of the heat dissipation structure 330 may be transferred to the outside of the heat dissipation structure 300 through a first outlet 510. A portion of the heat dissipation material transferred into the heat dissipation structure 330 along the first path P1 may be identified to the operator through a first opening 402. Another portion of the thermally conductive material in the heat dissipation structure 330 may be transferred to the other end 502 of the heat dissipation structure 330 along a second path P2. Another portion of the heat dissipation material transferred into the heat dissipation structure 330 along the second path P1 may be identified to the operator through a second opening 403. Another portion of the thermally conductive material transferred to the other end 502 of the heat dissipation structure 330 may be transferred to the outside of the heat dissipation structure 330 through a second outlet 520.

The portion of the thermally conductive material transferred to the first outlet 510 may be transferred to a first cavity 410 of the first shield can 310 along a third path P3. The portion of the thermally conductive material transferred to the first shield can 310 may be disposed in the first component 311. The other portion of the thermally conductive material transferred to the second outlet 520 may be transferred to a second cavity 420 of the second shield can 320 along a fourth path P4. The other portion of the thermally conductive material transferred into the second shield can 320 may be applied to an inner surface of the second shield can 320 or may be applied onto the printed circuit board 150 within the second shield can 320.

Figure 9:
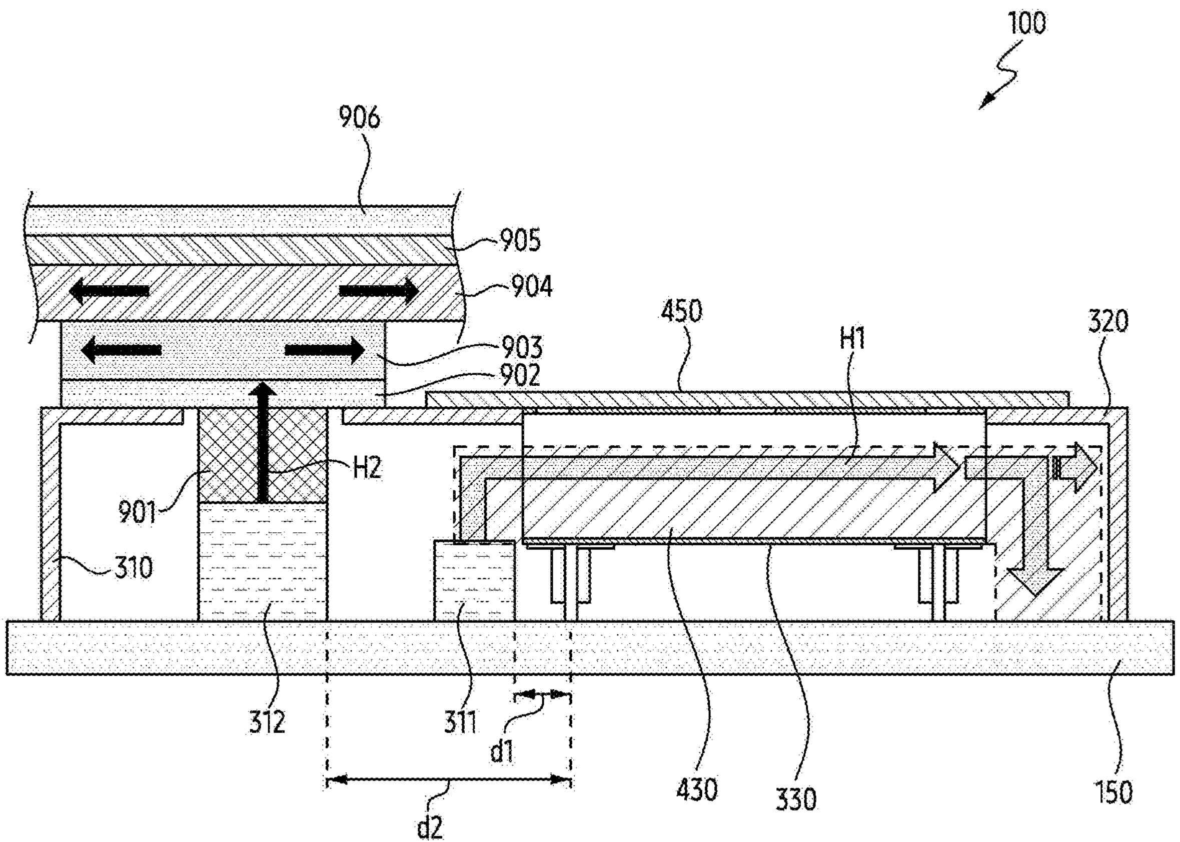
FIG. 9 is a diagram illustrating a transfer path of heat emitted from components inside a shield can according to various embodiments.

FIG. 9 is a diagram illustrating an example transfer path of heat emitted from components inside a shield can according to various embodiments.

Referring to FIG. 9, heat generated from a first component 311 may be transferred along a path independent of a transfer path of heat generated from another component 312 disposed in a first shield can 310. For example, the heat generated from the first component 311 and the heat generated from the second component 312 may be transferred through different paths.

The first component 311 may be spaced apart from the second component 312. The first component 311 and the second component 312 may be components that generate heat during operation of the electronic device 100. The first component 311 may be disposed adjacent to the first shield can 310, and the second component 312 may be spaced apart from the first shield can 310. For example, a distance d1 between the first component 311 and a side surface (e.g., the side surface 411 of FIG. 4A) may be less than a distance d2 between the second component 311 and the side surface 411. For example, the first component 311 may be disposed within 1 mm from the side surface 411 of the first shield can 310, and the second component 312 may be spaced apart from the side surface 411 of the first shield can 310 by 1 mm or more. The distance d1 may be 0.15 mm, and the distance d2 may be 1 mm or more. As the first component 311 may be disposed adjacent to the side surface 411 of the first shield can 310 unlike the second component 312, an attachment space of a first heat dissipation material 901 and a second heat dissipation material 902 disposed on the second component 312 may be insufficient. The first heat dissipation material 901 may be a TIM applied on the first component 312. The second heat dissipation material 902 may be a nano TIM applied to the first heat transfer material 901 and an upper surface (e.g., the upper surface 411' of FIG. 4*b*) of the first shield can 310. The volume of the first component 311 may be smaller than the volume of the second component 312. The first component 311 smaller than the second component 312 may be difficult to surface contact with another heat dissipation structure 903 (e.g., the heat dissipation structure 340 of FIG. 3) different from the heat dissipation structure 330. The other heat dissipation structure 903 may include one of a steam chamber, a metal plate, or a heat pipe attached to a bracket 904 (or front metal). The other heat dissipation structure 903, which is a wide and flat structure, may disperse heat through surface contact with a heating element. A heat dissipation path of the first component 311 having a small contact area may be difficult to use the other heat dissipation structure 903. Heat generated from the first component 311 may be diffused to a heat transfer path different from the second component 312. The heat generated from the first component 311 may diffuse the heat to the second shield can 320 or an internal space surrounded by the second shield can 320, along a heat transfer path H1 formed through the heat dissipation structure 330 including the thermally conductive material 430 disposed inside the second shield can 320 and connected to the first component 311.

The heat generated from the second component 312 may be emitted to the outside along a heat transfer path H2. The heat transfer path H2 may be formed from a first heat dissipation material 901 applied on the second component 312 to a heat dissipation sheet 905 disposed on the bracket 904, and a display 906 or a cover in contact with the heat dissipation sheet 905, through the second heat dissipation material 902 disposed on the first heat dissipation material 901, the other heat dissipation structure 903 in contact with the second heat dissipation material 902, and the bracket 904 in contact with the other heat dissipation structure 903.

The electronic device 100 may reduce the influence of heat generation between different components (e.g., the first component 311 and the second component 312) inside one shield can (e.g., the first component 312), by securing a heat dissipation path for each component. The electronic device 100 may diffuse heat of a high heating component disposed on a side surface of the shield can, using the heat dissipation structure 330 according to an embodiment. Through a tape 450 disposed on the first shield can 310, the second shield can 320, and the heat dissipation structure 330 and including a conductive material, noise shielding performance of the first shield can 310 and the second shield can 320 may be improved.

Figure 10:
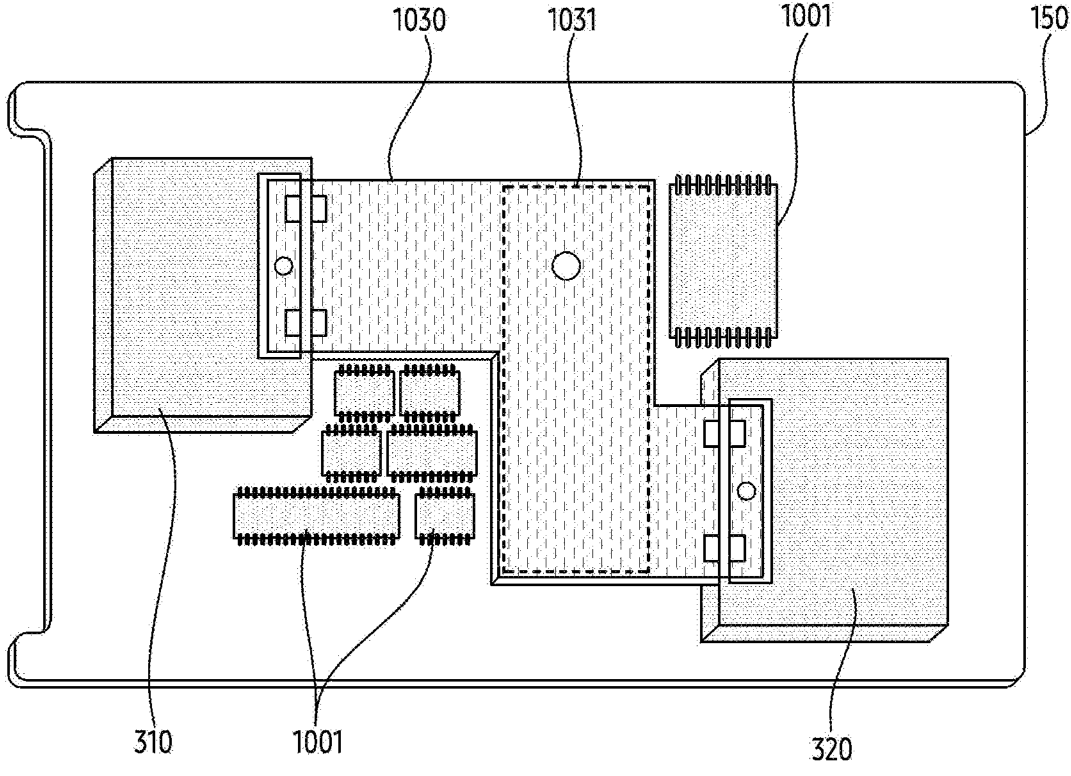
FIG. 10 is a diagram illustrating an arrangement of shield cans, devices, and a heat dissipation structure according to various embodiments.

FIG. 10 is a diagram illustrating an example arrangement of shield cans, devices, and a heat dissipation structure according to various embodiments.

Referring to FIG. 10, a first shield can 310, a second shield can 320, a plurality of elements 1001, and a heat dissipation structure 1030 may be disposed on a printed circuit board 150.

The plurality of elements 1001 may be disposed outside the first shield can 310 and the second shield can 320. The plurality of elements 1001 may be peripheral elements for operation of components disposed inside the first shield can 310 and/or components disposed inside the second shield can 320. For example, the plurality of elements 1001 may include a resistor, a capacitor, an inductor, or a ball grid array (BGA) IC.

As the plurality of elements 1001 are disposed adjacent to the shield cans 310 and 320, arrangement of a heat dissipation structure extending along one direction may be difficult. An end of the heat dissipation structure 1030 may be connected to the first shield can 310, and another end may be connected to the second shield can 320. The heat dissipation structure 1030 extending from the first shield can 310 to the second shield can 320 may form a bending portion 1031 to avoid the plurality of elements 1001. According to the arrangement of the plurality of elements 1001, the heat dissipation structure 1030 may include a plurality of bending portions.

The bending portion 1031 of the heat dissipation structure 1030 may be disposed parallel to a printed circuit board 1050 to avoid the elements 1001 disposed on the printed circuit board 1050, so that usability of a narrow space on the printed circuit board 150 may be improved.

Figure 11:
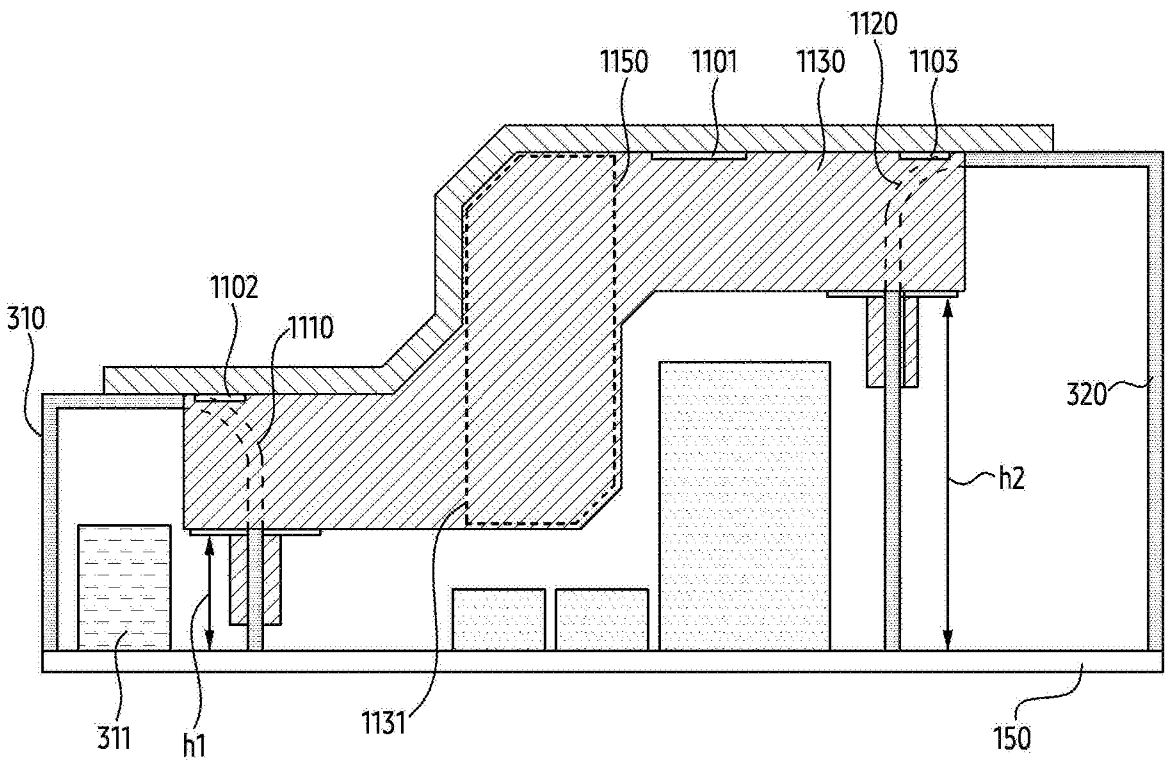
FIG. 11 is a diagram illustrating an example arrangement of shield cans, devices, and a vertically bent heat dissipation structure according to various embodiments.

FIG. 11 is a diagram illustrating an example arrangement of shield cans, devices, and a vertically bent heat dissipation structure according to various embodiments.

Referring to FIG. 11, the electronic device 100 may include a first shield can 310, a second shield can 320, a component 311, a plurality of elements 1101, and a heat dissipation structure 1030 on a printed circuit board 150. The plurality of elements 1101 may be disposed between the first shield can 310 and the second shield can 320. The first shield can 310 and the second shield can 320 may have different heights. The heat dissipation structure 1030 may be disposed to connect the first shield can 310 and the second shield can 320 having different heights.

For example, when the height of components disposed in an internal space of the second shield can 320 is higher than the height of components disposed in an internal space of the first shield can 310, the second shield can 320 may have a height higher than the first shield can 310. The first shield can 310 may include an opening 1110 for connection with the heat dissipation structure 1030. The second shield can 320 may include an opening 1120 for connection with the heat dissipation structure 1030. A height h1 from the printed circuit board 150 to the opening 1110 of the first shield can 310 may be lower than a height h2 from the printed circuit board 150 to the opening 1120 of the second shield can 320. In order to connect the opening 1110 of the first shield can 310 with the opening 1120 of the second shield can 320, a heat dissipation structure 1130 may include a bending portion 1150. A bending portion 1131 of the heat dissipation structure 1130 may be formed to avoid the elements 1101. The heat dissipation structure 1130 bent in a direction perpendicular to the printed circuit board 150 may thermally connect shield cans having different heights. For example, the heat emitted from the first component 311 may be diffused into the second shield can 320, through a thermally conductive material in the heat dissipation structure 1130.

The heat dissipation structure 1130 may include an inlet 1101 and a first opening 1102 and a second opening 1103 for identifying a thermally conductive material injected into the heat dissipation structure 1130. The inlet 1101 may be formed at a high position of the heat dissipation structure 1130, in order to easily supply the thermally conductive material to the first shield can 310 and the second shield can 320. For example, the inlet 1101 may be formed in a portion of the heat dissipation structure 1130 connected to the opening 1120 of the second shield can 320 having a relatively high height. The thermally conductive material introduced through the inlet 1101 disposed at the high position may be easily moved into the first shield can 310.

An electronic device including a plurality of heating components may include a structure for heat diffusing. Instead of a heat pipe or a metal plate applied to a component adjacent to the shield can, the electronic device may require a structure capable of diffusing heat emitted from components adjacent to the shield can into a relatively low-temperature region.

According to the above-described embodiment, an electronic device may include: a first shield can, a second shield can, a heat dissipation structure comprising a heat dissipating material, and a thermally conductive material. The first shield can may be configured to accommodate a component. The second shield can may be spaced apart from the first shield can. An end of the heat dissipation structure may be connected to a first shield can and another end thereof may be connected to a second shield can. The thermally conductive material may be disposed in the heat dissipation structure, extending from at least a portion of an inner space of the first shield can to at least a portion of an inner space of the second shield can through the heat dissipation structure. A first portion of a thermally conductive material may be disposed on at least a portion of an internal space of the heat dissipation structure. A second portion of the thermally conductive material may extend from the end of the heat dissipation structure to at least one surface of the component. A third portion of the thermally conductive material may extend from the other end of the heat dissipation structure to a second cavity. The electronic device may be configured to diffuse heat generated from the component in a direction of the second shield can through the thermally conductive material.

According to an example embodiment, the heat dissipation material may be configured to diffuse heat of the component generated during operation of the electronic device to the second shield can by connecting the component and a space within the second shield can.

According to an example embodiment, the electronic device may be configured to transfer the heat generated from the component along a path independent of a transfer path of heat generated from another component disposed within the first shield can.

According to an example embodiment, a plurality of heating components disposed in the first shield can may reduce the influence due to the heat of the other components, by diffusing the heat through different heat transfer paths, respectively. By reducing the influence due to the heat of components within the electronic device, the heat dissipation structure including the thermally conductive material may maintain performance of the electronic device.

According to an example embodiment, the component may be spaced apart from the other component. A distance between the component and a side surface of the first shield can contacting the heat dissipation structure may be shorter than a distance between the other component and the side surface of the first shield can.

According to an example embodiment, the distance between the component and the side surface of the first shield can may be less than 1 mm.

According to an example embodiment, the heat dissipation structure may be configured to diffuse heat generated from the heating component, adjacent to the shield can and difficult to arrange a plate and a heat pipe for heat dissipation, into a cooling region such as the peripheral shield can.

According to an example embodiment, the heat dissipation structure may include a pipe having a hollow hole accommodating the thermally conductive material and including a first opening, a second opening, and an inlet formed on an outer peripheral surface. The inlet may be disposed between the first opening and the second opening.

According to the above-described embodiment, the heat dissipation structure may include an inlet configured to inject the thermally conductive material therein, and inspect the thermally conductive material at least partially occupying the inside of the hollow hole through the first opening and the second opening. The performance of the heat dissipation structure may be secured by inspection of the thermally conductive material.

According to an example embodiment, the inlet may be closer to the first opening than the second opening.

According to the above-described embodiment, the heat dissipation structure may be configured to adjust the amount of thermally conductive material transferred to both ends of the heat dissipation structure, according to a position of the inlet. By adjusting the amount of thermally conductive material required for each location, manufacturing costs may be reduced.

According to an example embodiment, the heat dissipation structure may include a first outlet formed at the end of the heat dissipation structure disposed at an opening of the first shield can and a second outlet formed at the other end of the heat dissipation structure disposed at an opening of the second shield can.

According to the above-described embodiment, the heat dissipation structure may be configured to supply the thermally conductive material to a heating component and a cooling region through outlets formed at both ends. Heat may be diffused from the heating component to the cooling region through the supplied thermally conductive material.

According to an example embodiment, an area of the first outlet may be narrower than an area of the second.

According to the above-described embodiment, the heat dissipation structure may be configured to adjust the amount of thermally conductive material transferred to both ends of the heat dissipation structure, according to areas of the first outlet and the second outlet. By adjusting the amount of thermally conductive material required for each location, manufacturing costs may be reduced.

According to an example embodiment, the first outlet may be formed on a side surface disposed at the end of the heat dissipation structure, and the component may be overlapped with the first shield can, when a surface of the component in contact with the thermally conductive material is viewed in a vertical direction.

According to the above-described embodiment, the first outlet, disposed in the first shield can, may be configured to transfer the thermally conductive material within the heat dissipation structure. The transferred thermally conductive material may thermally connect the first component to the heat dissipation structure.

According to an example embodiment, the first outlet may be in contact with the component, and the component may be overlapped with the first outlet, when a surface of the component in contact with the thermally conductive material is viewed in a vertical direction.

According to the above-described embodiment, the heat dissipation structure disposed on a surface of the component may be configured to directly supply the thermally conductive material to the first component. A component disposed under the heat dissipation structure and in contact with the first outlet may contact the thermally conductive material. A thermal connection between the component and a cooling region (e.g., the second shield can) may be stably maintained.

According to an example embodiment, the electronic device may further include a tape. The tape may be attached to a portion of an outer surface of the first shield can, a portion of an outer peripheral surface of the heat dissipation structure, and a portion of an outer surface of the second shield can. The tape may be configured to fix the heat dissipation structure to the first shield can and the second shield can, and may include a conductive material.

According to an example embodiment, the tape may be configured limit movement of the heat dissipation structure in a vertical direction, by fixing the heat dissipation structure to the first shield can and the second shield can.

According to an example embodiment, another portion of the thermally conductive material may be applied to an inner surface of the second shield can.

According to the above-described embodiment, based on the thermally conductive material being in contact with the inner surface of the second shield can, heat generated from the component may be diffused to the second shield can through the thermally conductive material. Through the heat dissipation structure having the thermally conductive material, the electronic device may be configured to diffuse heat into a region, located around an internal component that is difficult to dissipate heat, and has a relatively low temperature.

According to an example embodiment, the heat dissipation structure may include a first leg, a second leg, a third leg, and a fourth leg.

According to an example embodiment, the first leg and the second leg may extend along a side surface of the first shield can where an opening of the first shield can is formed, and face each other. The third leg and the fourth leg may extend along a side surface of the second shield can where the first leg and the second leg and the opening of the second shield can are formed, and face each other.

According to an example embodiment, a portion of the side surface of the first shield can may be disposed between the first leg and the second leg.

According to an example embodiment, a portion of the side surface of the second shield can may be disposed between the third leg and the fourth leg.

According to the above-described embodiment, the first leg and the second leg may be configured to fix the heat dissipation structure and the first shield can. The third leg and the fourth leg may be configured to fix the heat dissipation structure and the second shield can. Movement of the heat dissipation structure in a horizontal direction may be limited by the first leg, the second leg, the third leg, and the fourth leg.

According to an example embodiment, the heat dissipation structure may include a pipe comprising a metal material.

According to an example embodiment, the pipe may be conjunct with the first leg, the second leg, the third leg, and the fourth leg.

According to an example embodiment, the heat dissipation structure and legs comprise metal, and may be welded or in conjunct. The conjunct legs and the heat dissipation structure may be used as one component.

According to an example embodiment, the electronic device may further include a printed circuit board and elements.

According to an example embodiment, the electronic component, the first shield can, and the second shield can may be disposed on the printed circuit board. The elements may be mounted on the printed circuit board outside the first shield can and the second shield can. The heat dissipation structure may include a bending portion configured to prevent interference with the elements.

According to an example embodiment, the electronic device may increase space efficiency through the heat dissipation structure manufactured to avoid interference with elements.

According to an example embodiment, a distance between the opening of the first shield can and the printed circuit board may be different from a distance between the opening of the second shield can and the printed circuit board. The bending portion may have a slope with respect to the printed circuit board.

According to an example embodiment, the heat dissipation structure having a bending portion may connect the first shield can and the second shield can having different heights. By being bent vertically to the printed circuit board, an element may be disposed between the printed circuit board and the heat dissipation structure, thereby increasing the utilization of a vertical space.

According to an example embodiment, the thermally conductive material may have viscosity.

According to an example embodiment, since the thermally conductive material is a fluid having viscosity, the thermally conductive material may be injected into the heat dissipation structure. Since the thermally conductive material injected into the heat dissipation structure may be transferred to the outside of the heat dissipation structure, the thermally conductive material may be applied to the component or introduced into the shield can. The thermally conductive material may be applied to the component or introduced into the shield can, and then cured to have a shape.

According to an example embodiment, the first shield can may include an opening formed on a side surface of the first shield can and another surface in contact with the side surface, and the second shield can may include an opening where another portion of the heat dissipation structure is disposed, wherein a portion of the heat dissipation structure is disposed in the opening included in the first shield can.

According to an example embodiment, the opening formed in the shield can may provide a structure fastening with the heat dissipation structure. The heat dissipation structure may be fixed by fitting a leg set to the side surface of the shield can in which the opening is formed. Through the opening formed in the shield can, the heat dissipation structure may be inserted into the shield can.

According to an example embodiment, the electronic device may include a board, a component, a shield can, and a heat dissipation structure comprising a heat dissipation material. The component may be mounted on the board, and may emit heat during operation of the electronic device. The shield can may be fixed on the board, may surround at least a portion of the component, and may include an opening region formed on a side wall. The cooling region may be spaced from the shield can, and may be configured to absorb the heat by maintaining a relatively lower temperature than the component.

According to an example embodiment, the heat dissipation structure may include a thermally conductive material with viscosity therein, be disposed at least partially within the shield can through the opening region, and extend from the shield can to the cooling region.

According to an example embodiment, the thermally conductive material may extend from an end of the heat dissipation structure to contact a surface of the component, and extend from another end of the heat dissipation structure to be disposed in the cooling region.

According to the above-described embodiment, a plurality of heating components disposed in the first shield can may reduce the influence of heat of other components, by diffusing heat through different heat transfer paths, respectively. Due to the reduction in the influence of heat of the components in the electronic device, the heat dissipation structure including the thermally conductive material may maintain the performance of the electronic device.

According to an example embodiment, the electronic device may further include an other component. The other component may be disposed in the shield can and may emit heat while the electronic device is operating. A heat transfer path of the other component may be independent of a heat transfer path of the component.

According to the above-described embodiment, components have independent heat transfer paths, thereby reducing the influence of heat between the components.

According to an example embodiment, the electronic device may further include a heat dissipation member comprising a heat dissipating material and another thermally conductive material. The heat dissipation member may be disposed on the shield can. The other thermally conductive material may connect the other component to the heat dissipating member, and may be applied to a surface of the other component.

According to an example embodiment, the shield can may include an opening overlapping the other component when viewed in a vertical direction, and wherein the other thermally conductive material passes through the opening.

According to an example embodiment, the cooling region may be another shield can distinguished from the shield can, a portion of a housing forming the exterior of the electronic device, or a metal portion in the electronic device.

According to the above-described embodiment, the other thermally conductive material may be configured to diffuse heat of the other component to the outside of the electronic device, through the other shield can, the portion of the housing, or metal portion of the bracket. Through the heat diffusion path secured in the electronic device, the electronic device may efficiently control heat generated during the operation of the electronic device.

FIG. 12 is a block diagram illustrating an example electronic device in a network environment according to various embodiments.

Referring to FIG. 12, the electronic device 1201 in the network environment 1200 may communicate with an electronic device 1202 via a first network 1298 (e.g., a short-range wireless communication network), or at least one of an electronic device 1204 or a server 1208 via a second network 1299 (e.g., a long-range wireless communication network). According to an embodiment, the electronic device 1201 may communicate with the electronic device 1204 via the server 1208. According to an embodiment, the electronic device 1201 may include a processor 1220, memory 1230, an input module 1250, a sound output module 1255, a display module 1260, an audio module 1270, a sensor module 1276, an interface 1277, a connecting terminal 1278, a haptic module 1279, a camera module 1280, a power management module 1288, a battery 1289, a communication module 1290, a subscriber identification module (SIM) 1296, or an antenna module 1297. In various embodiments, at least one of the components (e.g., the connecting terminal 1278) may be omitted from the electronic device 1201, or one or more other components may be added in the electronic device 1201. In various embodiments, some of the components (e.g., the sensor module 1276, the camera module 1280, or the antenna module 1297) may be implemented as a single component (e.g., the display module 1260).

The processor 1220 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions. The processor 1220 may execute, for example, software (e.g., a program 1240) to control at least one other component (e.g., a hardware or software component) of the electronic device 1201 coupled with the processor 1220, and may perform various data processing or computation. According to an embodiment, as at least part of the data processing or computation, the processor 1220 may store a command or data received from another component (e.g., the sensor module 1276 or the communication module 1290) in volatile memory 1232, process the command or the data stored in the volatile memory 1232, and store resulting data in non-volatile memory 1234. According to an embodiment, the processor 1220 may include a main processor 1221 (e.g., a central processing unit (CPU) or an application processor (AP)), or an auxiliary processor 1223 (e.g., a graphics processing unit (GPU), a neural processing unit (NPU), an image signal processor (ISP), a sensor hub processor, or a communication processor (CP)) that is operable independently from, or in conjunction with, the main processor 1221. For example, when the electronic device 1201 includes the main processor 1221 and the auxiliary processor 1223, the auxiliary processor 1223 may be adapted to consume less power than the main processor 1221, or to be specific to a specified function. The auxiliary processor 1223 may be implemented as separate from, or as part of the main processor 1221.

The auxiliary processor 1223 may control at least some of functions or states related to at least one component (e.g., the display module 1260, the sensor module 1276, or the communication module 1290) among the components of the electronic device 1201, instead of the main processor 1221 while the main processor 1221 is in an inactive (e.g., sleep) state, or together with the main processor 1221 while the main processor 1221 is in an active state (e.g., executing an application). According to an embodiment, the auxiliary processor 1223 (e.g., an image signal processor or a communication processor) may be implemented as part of another component (e.g., the camera module 1280 or the communication module 1290) functionally related to the auxiliary processor 1223. According to an embodiment, the auxiliary processor 1223 (e.g., the neural processing unit) may include a hardware structure specified for artificial intelligence model processing. An artificial intelligence model may be generated by machine learning. Such learning may be performed, e.g., by the electronic device 1201 where the artificial intelligence is performed or via a separate server (e.g., the server 1208). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1230 may store various data used by at least one component (e.g., the processor 1220 or the sensor module 1276) of the electronic device 1201. The various data may include, for example, software (e.g., the program 1240) and input data or output data for a command related thereto. The memory 1230 may include the volatile memory 1232 or the non-volatile memory 1234.

The program 1240 may be stored in the memory 1230 as software, and may include, for example, an operating system (OS) 1242, middleware 1244, or an application 1246.

The input module 1250 may receive a command or data to be used by another component (e.g., the processor 1220) of the electronic device 1201, from the outside (e.g., a user) of the electronic device 1201. The input module 1250 may include, for example, a microphone, a mouse, a keyboard, a key (e.g., a button), or a digital pen (e.g., a stylus pen).

The sound output module 1255 may output sound signals to the outside of the electronic device 1201. The sound output module 1255 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1260 may visually provide information to the outside (e.g., a user) of the electronic device 1201. The display module 1260 may include, for example, a display, a hologram device, or a projector and control circuitry to control a corresponding one of the display, hologram device, and projector. According to an embodiment, the display module 1260 may include a touch sensor adapted to detect a touch, or a pressure sensor adapted to measure the intensity of force incurred by the touch.

The audio module 1270 may convert a sound into an electrical signal and vice versa. According to an embodiment, the audio module 1270 may obtain the sound via the input module 1250, or output the sound via the sound output module 1255 or a headphone of an external electronic device (e.g., an electronic device 1202) directly (e.g., wiredly) or wirelessly coupled with the electronic device 1201.

The sensor module 1276 may detect an operational state (e.g., power or temperature) of the electronic device 1201 or an environmental state (e.g., a state of a user) external to the electronic device 1201, and then generate an electrical signal or data value corresponding to the detected state. According to an embodiment, the sensor module 1276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1277 may support one or more specified protocols to be used for the electronic device 1201 to be coupled with the external electronic device (e.g., the electronic device 1202) directly (e.g., wiredly) or wirelessly. According to an embodiment, the interface 1277 may include, for example, a high definition multimedia interface (HDMI), a universal serial bus (USB) interface, a secure digital (SD) card interface, or an audio interface.

A connecting terminal 1278 may include a connector via which the electronic device 1201 may be physically connected with the external electronic device (e.g., the electronic device 1202). According to an embodiment, the connecting terminal 1278 may include, for example, a HDMI connector, a USB connector, a SD card connector, or an audio connector (e.g., a headphone connector).

The haptic module 1279 may convert an electrical signal into a mechanical stimulus (e.g., a vibration or a movement) or electrical stimulus which may be recognized by a user via his tactile sensation or kinesthetic sensation. According to an embodiment, the haptic module 1279 may include, for example, a motor, a piezoelectric element, or an electric stimulator.

The camera module 1280 may capture a still image or moving images. According to an embodiment, the camera module 1280 may include one or more lenses, image sensors, image signal processors, or flashes.

The power management module 1288 may manage power supplied to the electronic device 1201. According to an embodiment, the power management module 1288 may be implemented as at least part of, for example, a power management integrated circuit (PMIC).

The battery 1289 may supply power to at least one component of the electronic device 1201. According to an embodiment, the battery 1289 may include, for example, a primary cell which is not rechargeable, a secondary cell which is rechargeable, or a fuel cell.

The communication module 1290 may support establishing a direct (e.g., wired) communication channel or a wireless communication channel between the electronic device 1201 and the external electronic device (e.g., the electronic device 1202, the electronic device 1204, or the server 1208) and performing communication via the established communication channel. The communication module 1290 may include one or more communication processors that are operable independently from the processor 1220 (e.g., the application processor (AP)) and supports a direct (e.g., wired) communication or a wireless communication. According to an embodiment, the communication module 1290 may include a wireless communication module 1292 (e.g., a cellular communication module, a short-range wireless communication module, or a global navigation satellite system (GNSS) communication module) or a wired communication module 1294 (e.g., a local area network (LAN) communication module or a power line communication (PLC) module). A corresponding one of these communication modules may communicate with the external electronic device via the first network 1298 (e.g., a short-range communication network, such as Bluetooth™, wireless-fidelity (Wi-Fi) direct, or infrared data association (IrDA)) or the second network 1299 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1292 may identify and authenticate the electronic device 1201 in a communication network, such as the first network 1298 or the second network 1299, using subscriber information (e.g., international mobile subscriber identity (IMSI)) stored in the subscriber identification module 1296.

The wireless communication module 1292 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1292 may support a high-frequency band (e.g., the mmWave band) to achieve, e.g., a high data transmission rate. The wireless communication module 1292 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1292 may support various requirements specified in the electronic device 1201, an external electronic device (e.g., the electronic device 1204), or a network system (e.g., the second network 1299). According to an embodiment, the wireless communication module 1292 may support a peak data rate (e.g., 20 Gbps or more) for implementing eMBB, loss coverage (e.g., 1264 dB or less) for implementing mMTC, or U-plane latency (e.g., 0.5 ms or less for each of downlink (DL) and uplink (UL), or a round trip of 12 ms or less) for implementing URLLC.

The antenna module 1297 may transmit or receive a signal or power to or from the outside (e.g., the external electronic device) of the electronic device 1201. According to an embodiment, the antenna module 1297 may include an antenna including a radiating element including a conductive material or a conductive pattern formed in or on a substrate (e.g., a printed circuit board (PCB)). According to an embodiment, the antenna module 1297 may include a plurality of antennas (e.g., array antennas). In such a case, at least one antenna appropriate for a communication scheme used in the communication network, such as the first network 1298 or the second network 1299, may be selected, for example, by the communication module 1290 (e.g., the wireless communication module 1292) from the plurality of antennas. The signal or the power may then be transmitted or received between the communication module 1290 and the external electronic device via the selected at least one antenna. According to an embodiment, another component (e.g., a radio frequency integrated circuit (RFIC)) other than the radiating element may be additionally formed as part of the antenna module 1297.

According to various embodiments, the antenna module 1297 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1201 and the external electronic device 1204 via the server 1208 coupled with the second network 1299. Each of the electronic devices 1202 or 1204 may be a device of a same type as, or a different type, from the electronic device 1201. According to an embodiment, all or some of operations to be executed at the electronic device 1201 may be executed at one or more of the external electronic devices 1202, 1204, or 1208. For example, if the electronic device 1201 should perform a function or a service automatically, or in response to a request from a user or another device, the electronic device 1201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1201. The electronic device 1201 may provide the outcome, with or without further processing of the outcome, as at least part of a reply to the request. To that end, a cloud computing, distributed computing, mobile edge computing (MEC), or client-server computing technology may be used, for example. The electronic device 1201 may provide ultra low-latency services using, e.g., distributed computing or mobile edge computing. In an embodiment, the external electronic device 1204 may include an internet-of-things (IoT) device. The server 1208 may be an intelligent server using machine learning and/or a neural network. According to an embodiment, the external electronic device 1204 or the server 1208 may be included in the second network 1299. The electronic device 1201 may be applied to intelligent services (e.g., smart home, smart city, smart car, or healthcare) based on 5G communication technology or IoT-related technology.

No claim element is to be construed under the provisions of 35 U.S.C. § 112, sixth paragraph, unless the element is expressly recited using the phrase "means for" or "means."

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1240) including one or more instructions that are stored in a storage medium (e.g., internal memory 1236 or external memory 1238) that is readable by a machine (e.g., the electronic device 1201). For example, a processor (e.g., the processor 1220) of the machine (e.g., the electronic device 1201) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server. According to various embodiments, each component (e.g., a module or a program) of the above-described components may include a single entity or multiple entities, and some of the multiple entities may be separately disposed in different components.

According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:

a first shield can configured to accommodate an electrical component;

a second shield can spaced apart from the first shield can;

a heat dissipation structure comprising a heat dissipation material including an end connected to the first shield can and another end connected to the second shield can; and a thermally conductive material disposed in the heat dissipation structure, extending from at least a portion of an inner space of the first shield can to at least a portion of an inner space of the second shield can through the heat dissipation structure;

wherein the electronic device is configured to diffuse heat generated from the component to the second shield can.

2. The electronic device according to claim 1, wherein the electronic device is configured to transmit heat generated from the electrical component along a path independent of a transfer path of heat generated from another electrical component disposed within the first shield can.

3. The electronic device according to claim 2, wherein the electrical component is spaced apart from the other electrical component, and wherein a distance between the electrical component and a side surface of the first shield can contacting the heat dissipation structure is shorter than a distance between the other electrical component and the side surface of the first shield can.

4. The electronic device according to claim 3, wherein the distance between the electrical component and the side surface of the first shield can is less than 1 mm.

5. The electronic device according to claim 1, wherein the heat dissipation structure includes a case including a first opening, a second opening, and an inlet formed on an outer peripheral surface, and wherein the inlet is disposed between the first opening and the second opening.

6. The electronic device according to claim 5, wherein the inlet is closer to the first opening than the second opening.

7. The electronic device according to claim 1, wherein the heat dissipation structure includes a first outlet formed at the end of the heat dissipation structure disposed in the first shield can and a second outlet formed at the other end of the heat dissipation structure disposed in the second shield can.

8. The electronic device according to claim 7, wherein an area of the first outlet is narrower than an area of the second outlet.

9. The electronic device according to claim 7, wherein the first outlet is spaced apart from the electrical component, and wherein the electrical component overlaps the first shield can, when a surface of the component in contact with the thermally conductive material is viewed in a vertical direction.

10. The electronic device according to claim 7, wherein the first outlet faces the electrical component, and wherein the electrical component overlaps the first outlet, when a surface of the component in contact with the thermally conductive material is viewed in a vertical direction.

11. The electronic device according to claim 1, further comprising a tape attached to a portion of an outer surface of the first shield can, a portion of an outer peripheral surface of the heat dissipation structure, and a portion of an outer surface of the second shield can, and includes a conductive material.

12. The electronic device according to claim 1, the thermally conductive material extending in the second shield can is applied to an inner surface of the second shield can.

13. The electronic device according to claim 1, wherein the heat dissipation structure includes:

a first leg and a second leg extending along a side surface of the first shield can where an opening of the first shield can is formed and facing each other; and a third leg and a fourth leg extending along a side surface of the second shield can where an opening of the second shield can is formed and facing each other, wherein a portion of the side surface of the first shield can is disposed between the first leg and the second leg, and wherein a portion of the side surface of the second shield can is disposed between the third leg and the fourth leg.

14. The electronic device according to claim 13, wherein the heat dissipation structure includes a pipe comprising a metal material, and wherein the pipe is conjunct to the first leg, the second leg, the third leg, and the fourth leg.

15. The electronic device according to claim 1, further comprising:

a printed circuit board on which the electrical component, the first shield can and the second shield can are disposed; and a plurality of elements mounted on the printed circuit board outside the first shield can and the second shield can;

wherein the heat dissipation structure includes a bending portion configured to avoid interference with the elements.

16. The electronic device according to claim 15, wherein a distance between an opening of the first shield can and the printed circuit board is different from a distance between an opening of the second shield can and the printed circuit board, and wherein the bending portion has a slope with respect to the printed circuit board.

17. The electronic device according to claim 1, wherein the thermally conductive material has viscosity.

18. The electronic device according to claim 1, the first shield can includes an opening formed on a side surface of the first shield can and another surface in contact with the side surface, wherein a portion of the heat dissipation structure is disposed in the opening included in the first shield can, and wherein the second shield can includes an opening where another portion of the heat dissipation structure is disposed.

19. An electronic device comprising:

a board;

an electrical component disposed on the board and configured to emit heat during operation of the electronic device;

a shield can disposed on the board, surrounding at least a portion of the electrical component, and including an opening region formed on a side wall;

a cooling region spaced from the shield can and configured to absorb the heat; and a heat dissipation structure comprising a heat dissipation material including a thermally conductive material having viscosity therein, disposed at least partially within the shield can through the opening region, and extending from the shield can to the cooling region;

wherein the thermally conductive material extends from an end of the heat dissipation structure to contact a surface of the electrical component, and extends from another end of the heat dissipation structure to be disposed in the cooling region.

20. The electronic device according to claim 19, further comprising:

another electrical component disposed in the shield can and configured to emit heat during operation of the electronic device;

a heat dissipation member comprising a heat dissipation material disposed on the shield can; and another thermally conductive material connecting the other electrical component and the heat dissipation member and applied on a surface of the other component, wherein the shield can includes an opening through which the other thermally conductive material passes and the opening overlaps the other component when viewed in a direction perpendicular to the other component, wherein a heat transfer path of the other electrical component is independent of a heat transfer path of the component, wherein the cooling region includes another shield can distinct from the shield can, a part of a housing forming an exterior of the electronic device, or a metal portion within the electronic device.

* * * * *